US012094836B2

(12) United States Patent
Hung et al.

(10) Patent No.: US 12,094,836 B2
(45) Date of Patent: Sep. 17, 2024

(54) SEMICONDUCTOR DEVICE HAVING HEAT DISSIPATION STRUCTURE OF CURVED PROFILE AND A MANUFACTURING METHOD THEREOF

(71) Applicant: Taiwan Semiconductor Manufacturing Company, Ltd., Hsinchu (TW)

(72) Inventors: Wensen Hung, Hsinchu County (TW); Hsuan-Ning Shih, Taoyuan (TW); Hsien-Pin Hu, Hsinchu County (TW); Tsung-Shu Lin, New Taipei (TW); Tsung-Yu Chen, Hsinchu (TW); Wen-Hsin Wei, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 519 days.

(21) Appl. No.: 17/033,574

(22) Filed: Sep. 25, 2020

(65) Prior Publication Data

US 2022/0102288 A1 Mar. 31, 2022

(51) Int. Cl.
*H01L 23/34* (2006.01)
*H01L 21/48* (2006.01)
(Continued)

(52) U.S. Cl.
CPC ........ *H01L 23/562* (2013.01); *H01L 21/4817* (2013.01); *H01L 21/4871* (2013.01);
(Continued)

(58) Field of Classification Search
CPC ... H01L 23/562; H01L 23/367; H01L 23/053; H01L 21/4817; H01L 21/4871;
(Continued)

(56) References Cited

U.S. PATENT DOCUMENTS 5,949,137 A * 9/1999 Domadia ............ H01L 23/4006
361/764
7,009,307 B1 * 3/2006 Li ..................... H01L 21/50
438/118
(Continued)

FOREIGN PATENT DOCUMENTS

CN 105009439 A * 10/2015 ............ H02M 7/003
JP 2000323624 A * 11/2000 ........... H01L 21/563
(Continued)

*Primary Examiner* — Ismail A Muse
(74) *Attorney, Agent, or Firm* — JCIPRNET

(57) ABSTRACT

A semiconductor device includes a circuit substrate, a semiconductor package, and a metallic cover. The semiconductor package is disposed on the circuit substrate. The metallic cover is disposed over the semiconductor package and over the circuit substrate. The metallic cover comprises a cap and outer flanges. The cap overlies the semiconductor package. The outer flanges are disposed at edges of the cap, are connected with the cap, and extend towards the circuit substrate. A region of the bottom surface of the cap has a curved profile matching a warpage profile of the semiconductor package and the circuit substrate, and the region having the curved profile extends over the semiconductor package.

20 Claims, 25 Drawing Sheets

(51) Int. Cl.
*H01L 21/52* (2006.01)
*H01L 23/00* (2006.01)
*H01L 23/053* (2006.01)
*H01L 23/367* (2006.01)

(52) U.S. Cl.
CPC ............ *H01L 21/52* (2013.01); *H01L 23/053* (2013.01); *H01L 23/367* (2013.01)

(58) Field of Classification Search
CPC ..... H01L 23/04; H01L 21/52; H01L 23/5384; H01L 23/3736; H01L 21/50; H01L 23/10; H01L 23/3735; H01L 23/40; H01L 23/373; H01L 23/3737; H01L 2023/4037; H01L 2023/4056; H01L 2023/4062; H01L 2224/32225; H01L 2224/16225; H01L 2924/3511; H01L 2224/73204; H01L 2924/00
USPC .......................................................... 257/717
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2006/0199299 | A1* | 9/2006 | Deshpande ......... H01L 21/4882 438/106 |
| 2008/0185713 | A1* | 8/2008 | Dani ...................... H01L 23/42 257/E23.101 |
| 2011/0079902 | A1* | 4/2011 | Sakamoto ............ H01L 21/563 257/788 |
| 2014/0252572 | A1* | 9/2014 | Hou ...................... H01L 21/561 438/112 |
| 2015/0187679 | A1* | 7/2015 | Ho ........................ H01L 23/055 438/118 |
| 2015/0279761 | A1* | 10/2015 | Bet-Shliemoun ....... H01L 23/42 257/714 |
| 2015/0279762 | A1* | 10/2015 | Lowe .................. H01L 23/3737 252/75 |
| 2019/0021162 | A1* | 1/2019 | Viswanathan ........ H01L 23/367 |
| 2019/0043777 | A1* | 2/2019 | Hyung .................... H01L 23/42 |
| 2019/0074252 | A1* | 3/2019 | Chigullapalli ........ H01L 23/367 |
| 2019/0157183 | A1* | 5/2019 | Kai ....................... H01L 23/041 |
| 2019/0221498 | A1* | 7/2019 | Wu ....................... H01L 23/433 |
| 2020/0402882 | A1* | 12/2020 | Kim ..................... H01L 23/367 |
| 2021/0109284 | A1* | 4/2021 | Meade .................. G02B 6/1225 |
| 2021/0407963 | A1* | 12/2021 | Lin ....................... H01L 23/367 |

FOREIGN PATENT DOCUMENTS

| | | | | |
|---|---|---|---|---|
| KR | 20210075270 | A | * 6/2021 | |
| KR | 102451649 | B1 | * 10/2022 | ............ H02M 7/003 |
| WO | WO-2022041010 | A1 | * 3/2022 | ............ H02M 7/003 |

* cited by examiner

SEMICONDUCTOR DEVICE HAVING HEAT DISSIPATION STRUCTURE OF CURVED PROFILE AND A MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 to FIG. 10A are schematic cross-sectional views of semiconductor devices according to some embodiments of the disclosure.

DETAILED DESCRIPTION

Figure 1:
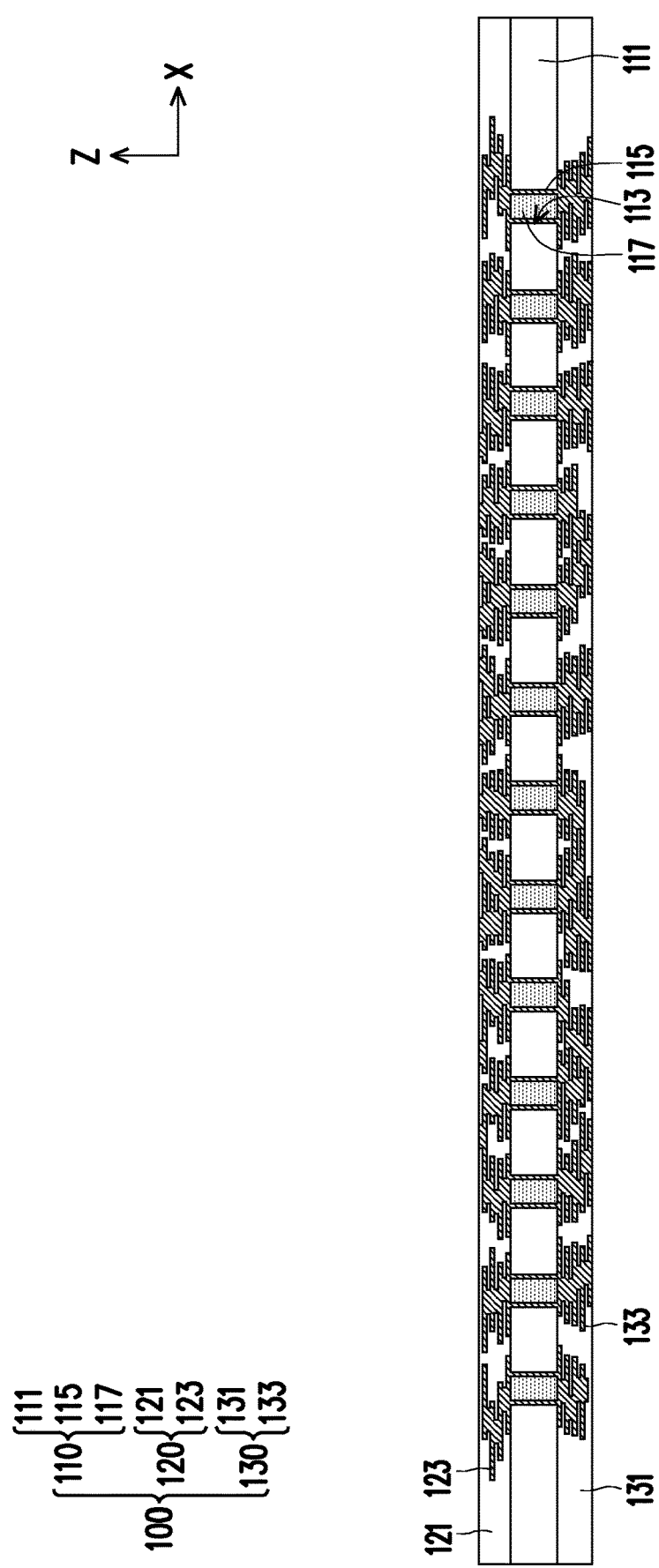
FIG. 1, FIG. 2A, FIG. 3 and FIG. 4 are schematic cross-sectional views of structures produced at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 4 are schematic cross-sectional views of structures produced at various stages of a manufacturing method of a semiconductor device SD10 according to some embodiments of the present disclosure. Referring to FIG. 1, in some embodiments a circuit substrate 100 is provided. In some embodiments, the circuit substrate 100 includes a core layer 110 and build-up layers 120, 130 disposed on opposite sides of the core layer 110. The core layer 110 may include a dielectric layer 111 having through holes 113 which cross the dielectric layer 111 from side to side. The through holes 113 may be lined with conductive material forming the through vias 115. In some embodiments, the through vias 115 only partially fill (e.g., line the edges of) the through holes 113, which are filled by a dielectric filling 117. In some alternative embodiments, the through holes 113 are filled by the through vias 115. In some embodiments, each build-up layer 120 or 130 respectively includes a dielectric layer 121 or 131 and conductive patterns 123 or 133 embedded in the corresponding dielectric layer 121 or 131 and providing electrical connection between opposite sides of the corresponding dielectric layer 121 or 131. In some embodiments, the build-up layers 120, 130 may independently include more or fewer dielectric layers 121, 131 and conductive patterns 123, 133 than what is illustrated in FIG. 1, according to the routing requirements. In some embodiments, the through vias 115 establish electrical connection between the conductive patterns 123 of one build-up layer 120 with the conductive patterns 133 of the other build-up layer 130. In some embodiments, at least one of the build-up layers 120, 130 (e.g., the build-up layer 120) is exposed for further processing.

Figure 2A:
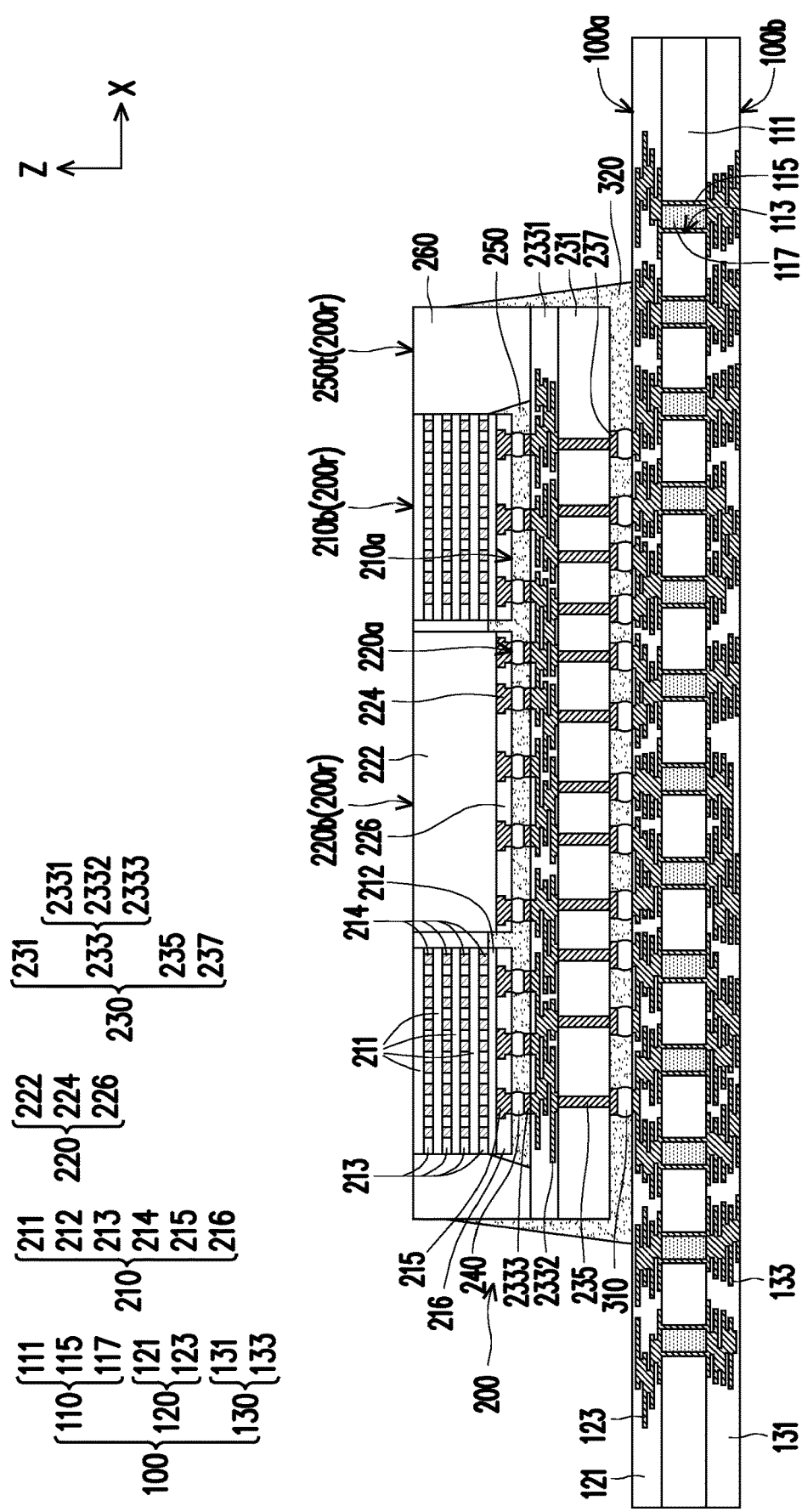
Figure 2B:
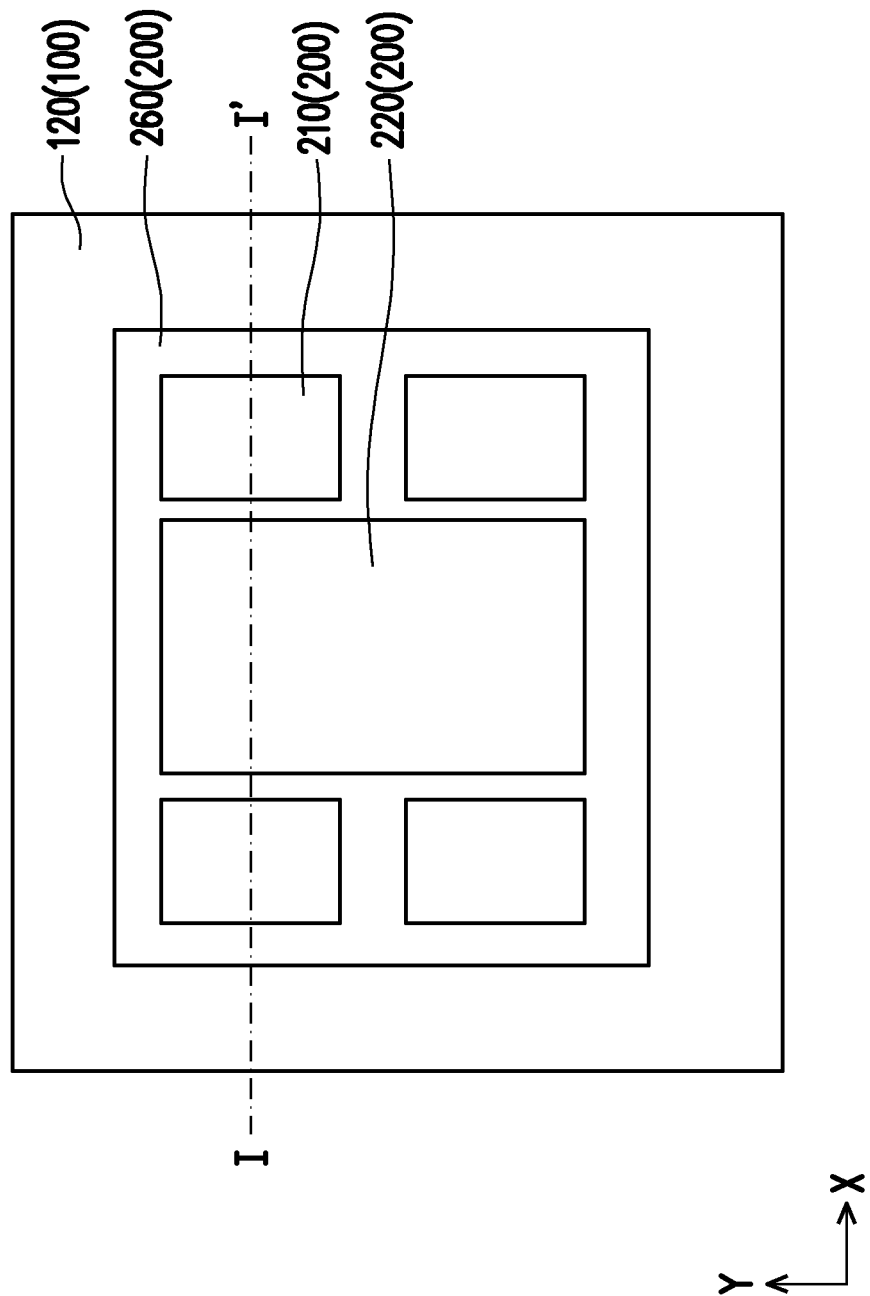
FIG. 2B is a schematic top view of the structure illustrated in FIG. 2A.

FIG. 2A is a schematic cross-sectional view of a structure produced during a subsequent step of manufacturing process with respect to FIG. 1. The cross-sectional view of FIG. 2A and the cross-sectional view of FIG. 1 may be taken along the same plane (e.g., an XZ plane) corresponding to the level height along the Y direction of the line I-I' (illustrated in FIG. 2B). FIG. 2B is a schematic top view of the structure illustrated in FIG. 2A. Referring to FIG. 2A and FIG. 2B, in some embodiments a semiconductor package 200 is connected to an exposed side 100a of the circuit substrate 100 (e.g., the side of the build-up layer 120). In some embodiments, the semiconductor package 200 includes one or more chips 210, 220. In some embodiments, the chips 210, 220 may have different structures and perform different functions. For example, one or more of the chips 210 may be memory chips (e.g., high-bandwidth memories), while one or more of the chips 220 may be or include a logic die, such as a central processing unit (CPU) die, a graphic processing unit (GPU) die, a micro control unit (MCU) die, an input-output (I/O) die, a baseband (BB) die, or an application processor (AP) die. For example, a chip 210 may include semiconductor dies 211 stacked over a base die 212. The semiconductor dies 211 may be separated from each other by portions of insulating material 213, and be vertically interconnected, for example, through micro-bumps 214. Contact pads 215 encircled by a protective layer 216 may be formed at the active surface 210a of the chip 210, at an opposite side of the base die 212 with respect to the semiconductor dies 211. In some embodiments, a chip 220 may include a semiconductor substrate 222, contact pads 224 and a passivation layer 226. The contact pads 224 may be formed on a top surface of the semiconductor substrate 222. The passivation layer 226 may cover the front surface of the semiconductor substrate 222 and have a plurality of openings that exposes at least a portion of each contact pad 224. As a way of example, in FIG. 2B the semiconductor package 200 is illustrated as including a chip 220 and four chips 210 disposed at the corner of the semiconductor package 200, at the sides of the chip 220. However, the disclosure is not limited by the type, number, or structure of the chips 210, 220 included in the semiconductor package 200.

In some embodiments, the chips 210, 220 are bonded to an interposer 230. In some embodiments, the interposer 230 includes a semiconductor substrate 231, an interconnection structure 233, through semiconductor vias (TSVs) 235, and contact pads 237. In some embodiments, the interposer 230 includes a semiconductor (e.g., silicon) wafer as semiconductor substrate 231. In some embodiments, the interconnection structure 233 is disposed on the semiconductor substrate 231 and includes a dielectric layer 2331, conductive patterns 2332 and under-bump metallurgies 2333. For simplicity, the dielectric layer 2331 is illustrated as a single dielectric layer and the conductive patterns 2332 are illustrated as embedded in the dielectric layer 2331. Nevertheless, from the perspective of the manufacturing process, the dielectric layer 2331 is constituted by at least two dielectric layers. The conductive patterns 2332 may be sandwiched between two adjacent dielectric layers. Some of the conductive patterns 2332 may extend vertically through the dielectric layer 2331 to establish electrical connection between different metallization tiers of the interconnection structure 233. In some embodiments, the (outermost) dielectric layer 2331 may be patterned to expose the underlying conductive patterns 2332. The under-bump metallurgies 2333 may optionally be conformally formed in the openings of the (outermost) dielectric layer 2331 exposing the conductive patterns 2332 and may further extend over portions of the exposed surface of the (outermost) dielectric layer 2331. In some embodiments, the under-bump metallurgies 2333 include multiple stacked layers. For example, the under-bump metallurgies 2333 may include one or more metallic layers stacked on a seed layer. In some embodiments, the material of the dielectric layer 2331 includes polyimide, epoxy resin, acrylic resin, phenol resin, benzocyclobutene (BCB), polybenzooxazole (PBO), or any other suitable polymer-based dielectric material. The dielectric layer 2331, for example, may be formed by suitable fabrication techniques such as spin-on coating, chemical vapor deposition (CVD), plasma-enhanced chemical vapor deposition (PECVD), or the like. In some embodiments, materials of the conductive patterns 2332 and the under-bump metallurgies 2333 include aluminum, titanium, copper, nickel, tungsten, or alloys thereof. The conductive patterns 2332 and the under-bump metallurgies 2333 may be formed by, for example, electroplating, deposition, and/or photolithography and etching. It should be noted that the number of the dielectric layers 2331, the number of the conductive patterns 2332, and the number of under-bump metallurgies 2333 illustrated in FIG. 2A are merely for illustrative purposes, and the disclosure is not limited thereto. In some alternative embodiments, fewer or more layers of the dielectric layers 2331, conductive patterns 2332 or under-bump metallurgies 2333 may be formed depending on the circuit design.

In some embodiments, the TSVs 235 are formed in the semiconductor substrate 231, and provide dual-side electrical connection through the semiconductor substrate 231. In some embodiments, one end of a TSV 235 is connected to the conductive patterns 2332 of the interconnection structure 233 and the other end of the same TSV 235 is connected to a contact pad 237 formed on a side of the semiconductor substrate 231 opposite to the interconnection structure 233. In some embodiments, a material of the TSVs 235 includes one or more metals. In some embodiments, the metal material of the TSVs 235 includes copper, titanium, tungsten, aluminum, combinations thereof, or the like.

In some embodiments, the chips 210, 220 are bonded via connectors 240 to the interposer 230. In some embodiments, the connectors 240 are micro-bumps installed on the contact pads 215, 224 and sandwiched between the contact pads 215, 224 and the under-bump metallurgies 2333 or the TSVs 235 (if no interconnection structure 233 is included in the interposer 230). According to some embodiments, the chips 210, 220 are disposed with the active surfaces 210a, 220a (the surfaces exposing the contact pads 215, 224) facing the interposer 230.

In some embodiments, an underfill 250 may be disposed between the chips 210, 220 and the interposer 230 to protect the connectors 240 against thermal or physical stress and secure the electrical connection of the chips 210, 220 to the interposer 230. In some embodiments, the underfill 250 is formed by capillary underfill filling (CUF). In some embodiments, as shown in FIG. 2A, a single common underfill 250 may extend below the chips 210, 220 depending on the spacing and relative positions of the chips over the interposer 230. In some alternative embodiments, multiple underfill portions (not shown) are formed, each portion securing the connectors 240 of a chip 210, 220. In some embodiments, an encapsulant 260 is formed over the interposer 230 wrapping the chips 210, 220 and the underfills 250. In some embodiments, the encapsulant 260 may include a molding compound, a molding underfill, a resin (such as an epoxy resin), or the like. In some embodiments, the encapsulant 260 is formed by an over-molding process. In some embodiments, the encapsulant 260 may leave exposed the backside surfaces 210b, 220b of the chips 210, 220. That is, a top surface 250t of the encapsulant and the backside surfaces 210b, 220b of the chips 210, 220 may constitute a rear surface 200r of the semiconductor package 200. In some embodiments, the semiconductor package 200 may include more or fewer chips 210, 220 than what is illustrated in FIG. 2A, as well as other components (e.g., dummy dies, stress release layers, interconnect structures, support pillars, etc.). Furthermore, whilst the process is currently being illustrated for a Chip-on-Wafer-(CoW) package 200, the disclosure is not limited to the package structure shown in the drawings, and other types of semiconductor package such as integrated fan-out (InFO) packages, package-on-packages (PoP), etc., are also meant to be covered by the present disclosure and to fall within the scope of the appended claims.

In some embodiments, conductive terminals 310 are disposed between the contact pads 237 of the semiconductor package 200 and the portions of the conductive patterns 123 of the build-up layer 120 exposed by the (outermost) dielectric layer 121. In some embodiments, the conductive terminals 310 are C4-bumps. In some embodiments, an underfill 320 is disposed between the semiconductor package 200 and the circuit substrate 100 to protect the conductive terminals 310 from thermal and mechanical stresses.

Figure 2C:
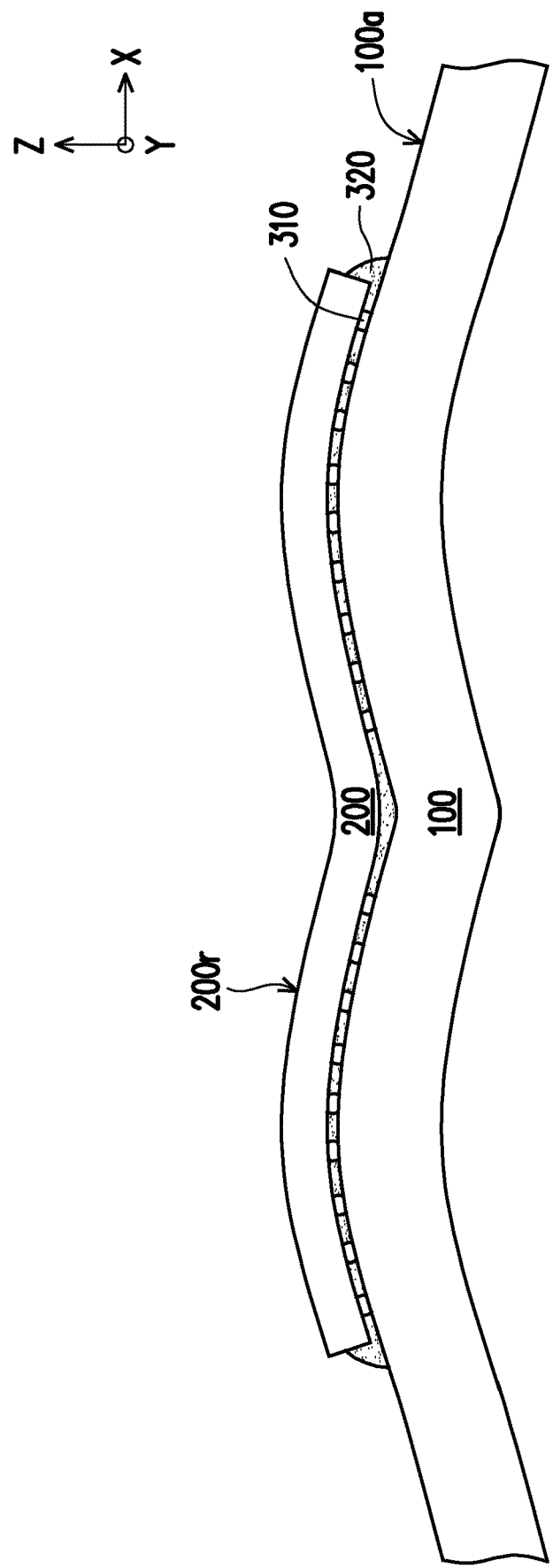
FIG. 2C is an alternative representation of the structure illustrated in FIG. 2A.

FIG. 2C is an alternative representation of the cross-sectional view of FIG. 2A. Details of the structures of the circuit substrate 100 and the semiconductor package 200 are omitted for clarity. While in the view of FIG. 2A the semiconductor package 200 and the circuit substrate 100 are represented as substantially flat, in some embodiments the semiconductor package 200 and the circuit substrate 100 may experience some warpage during the manufacturing process, resulting in a curved (warped) profile. That is, during the manufacturing process, heating steps may be required, for example for curing, soldering, reflowing, or the like. During these heating steps, the components included in the semiconductor package 200 and the circuit substrate 100 may expand, each one according to its own coefficient of thermal expansion (CTE). For example, components made mostly of semiconductor materials (such as the chips 210, 220) or metallic materials (such as the TSV 235 or the through vias 115) may have a different thermal behavior than the dielectric materials (e.g., the encapsulant 260, the underfills 250, 320, or the dielectric layers 111, 121, 131). As a result of this difference in thermal behavior, the semiconductor package 200 and the circuit substrate 100 may become deformed, i.e., warped, along one or more directions. For example, the semiconductor package 200 may already include a certain amount of warpage due to the heating steps required to solder the chips 210, 220 to the interposer 230, and, after bonding to the circuit substrate 100, the warpage of the bonded structure may be further increased. For example, in FIG. 2C the circuit substrate 100 and the semiconductor package 200 are illustrated as having a double-saddle profile, resulting in a double-arched shape. That is, the rear surface 200r of the semiconductor package 200 and the side 100a of the circuit substrate 100 on which the semiconductor package 200 is mounted may have a curved (warped, not flat) profile. For the rest of the disclosure, the semiconductor packages such as the semiconductor package 200 will be represented as illustrated in FIG. 2C for clarity of illustration. It will be apparent, however, that semiconductor packages and circuit substrates having different structures may have different warpage behavior, resulting in different curved profiles than the ones illustrated in FIG. 2C, and all such structures are also meant to be covered by the present disclosure and to fall within the scope of the appended claims.

Figure 3:
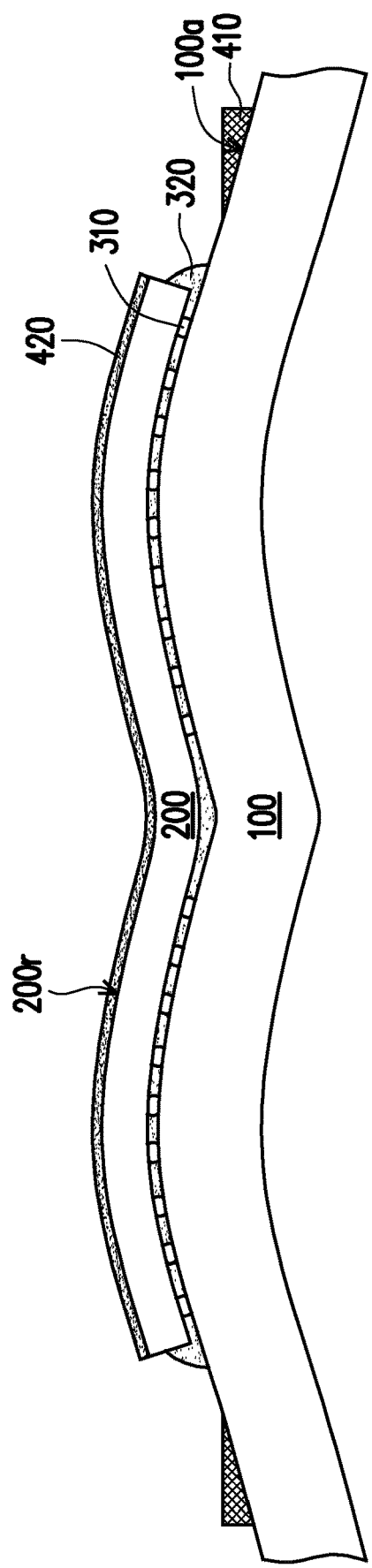

Referring to FIG. 3, in some embodiments, an adhesive 410 is disposed on the side 100a of the circuit substrate 100, in proximity of the outer periphery of the circuit substrate 100. In some embodiments, the adhesive 410 forms a frame following the profile of the outer periphery of the circuit substrate 100. For example, if the circuit substrate 100 has a rectangular footprint, the adhesive 410 may have the shape of a rectangular frame. Similarly, if the circuit substrate 100 has a circular footprint, the adhesive 410 may have the shape of a circular frame. In some embodiments, multiple portions of adhesive 410 are disposed on the circuit substrate 100. That is, the frame formed by the adhesive 410 may be discontinuous, presenting gaps in which the circuit substrate 100 is exposed in between consecutive portions of adhesive 410. In some embodiments, the adhesive 410 includes a thermocurable adhesive, a photocurable adhesive, a thermally conductive adhesive, a thermosetting resin, a waterproof adhesive, a lamination adhesive, or a combination thereof. In some embodiments, the adhesive 410 includes a thermally conductive adhesive. In some embodiments, the adhesive 410 includes a metallic layer (not shown) with solder paste (not shown) deposited thereon. According to the type of material used, the adhesive 410 may be formed by deposition, lamination, printing, plating, or any other suitable technique.

In some embodiments, a thermal interface material (TIM) 420 is disposed on the rear surface 200r of the semiconductor package 200, in contact with the backside surfaces 210b, 220b of the chips 210, 220 (illustrated, e.g., in FIG. 2A). In some embodiments, the TIM 420 further extends over the encapsulant 260 (illustrated, e.g., in FIG. 2A). In some embodiments, the TIM 420 is an adhesive material. In some embodiments, the TIM 420 includes a grease-based material, a phase change material, a gel, an adhesive, a polymeric material, a metallic material, a liquid metal thermal compound, or a combination thereof. In some embodiments, the TIM 420 includes lead-tin based solder (PbSn), silver paste (Ag), gold, tin, gallium, indium, rhodium, zinc or other suitable thermally conductive materials. According to the type of material used, the TIM 420 may be formed by deposition, lamination, printing, plating, or any other suitable technique. In some embodiments, the TIM 420 is a gel type material. In some embodiments, the TIM 420 may be a film type material. For example, the TIM 420 may be a sheet of conductive material (e.g., carbon nanotubes, graphene, or graphite) or a composite film with conductive materials such as fillers (e.g., powders, flake shape particles, nanotubes, fibers, etc.) embedded in a base material.

Figure 4:
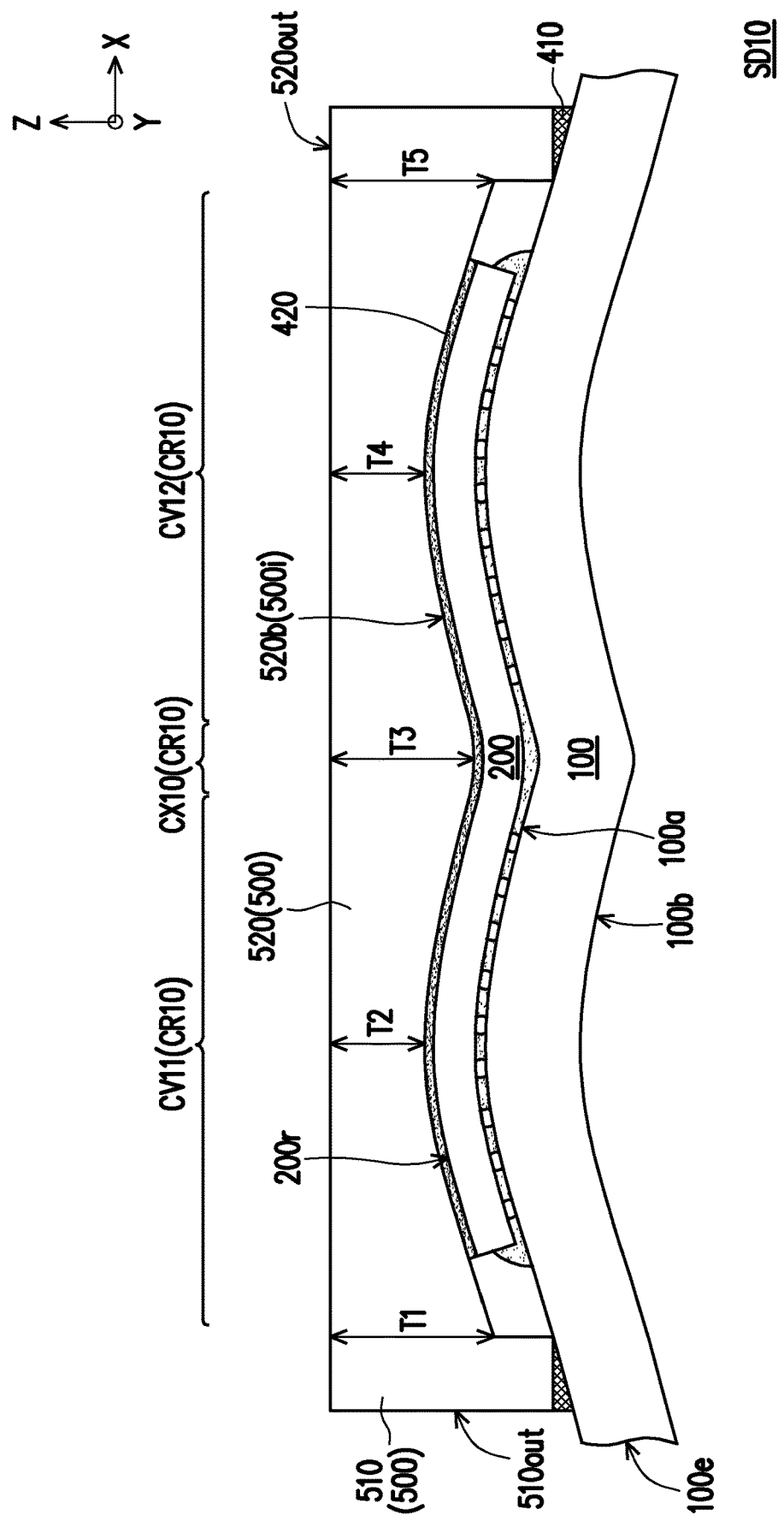

FIG. 4 is a cross-sectional view of the semiconductor device SD10 according to some embodiments of the disclosure. In some embodiments, manufacturing the semiconductor device SD10 includes disposing a metallic cover 500 on the circuit substrate 100, for example on the structure illustrated in FIG. 3. In some embodiments, the metallic cover 500 may be made of a conductive material. For example, the metallic cover 500 may include a metallic material or metallic alloys or semiconductor material such as stainless steel, silicon carbide alloy, machinable ceramic, dummy silicon, kovar, invar, copper alloys, molybdenum, copper- or nickel-clad molybdenum, copper-clad Invar, copper tungsten, aluminum, diamond composites, metal diamond alloys, silver diamond or a combination thereof. In some embodiments, the metallic cover 500 may be subjected to an anodization or passivation treatment (e.g., with nickel) to enhance its environmental resistance before it is installed on the circuit substrate 100. In some embodiments, a footprint of the metallic cover 500 substantially matches the footprint of the circuit substrate 100. In some embodiments, the metallic cover 500 includes outer flanges 510 and a cap 520. The metallic cover 500 is placed over the circuit substrate 100. In some embodiments, before placing the metallic cover 500, the metallic cover 500 is vertically aligned with the circuit substrate 100 and the footprint of the metallic cover 500 matches with the footprint of the circuit substrate 100. The outer flanges 510 may be disposed at the periphery of the cap 520. That is, the outer flanges 510 may be located at the edge of the cap 520, and project towards the circuit substrate 100. In some embodiments, an outer edge 510 out of the outer flanges 510 falls in proximity of the outer edge 100e of the circuit substrate 100. In some embodiments, the outer edge 100e of the circuit substrate 100 is the peripheral surface joining the side 100a of the circuit substrate 100 with the opposite side 100b. In some embodiments, the cap 520 is disposed over the circuit substrate 100 and the semiconductor package 200. In some embodiments, if the outer flanges 510 extend from the cap 520 to the circuit substrate 100 along a vertical direction (e.g., the Z direction), the cap 520 may be considered to extend along the X and Y directions to cover the footprint of the circuit substrate 100. In some embodiments, the outer flanges 510 and the cap 520 are integrally formed. That is, the outer flanges 510 and the cap 520 may be formed as a single piece, jointed to each other without a clear interface between the two. In some embodiments, the outer flanges 510 extend towards the circuit substrate 100 and encircle the semiconductor package 200. In some embodiments, the outer flanges 510, the cap 520, and the circuit substrate 100 define an enclosed space surrounding the semiconductor package 200 on all sides. That is, the semiconductor package 200 may be fully contained (enclosed) by the circuit substrate 100 and the metallic cover 500. In some alternative embodiments, the outer flanges 510 do not entirely enclose the semiconductor package 200. That is, the outer flanges 510 may face only two opposite sides of the semiconductor package 200, leaving the other sides exposed. In some embodiments, the outer flanges 510 reach the circuit substrate 100 where the adhesive 410 is disposed. The adhesive 410 may secure the outer flanges 510 to the circuit substrate 100. In some embodiments, the adhesive 410 is disposed on the circuit substrate 100 only where the outer flanges 510 are expected to contact the circuit substrate 100.

In some embodiments, a span of the cap 520 exceeds a span of the semiconductor package 200. In some embodiments, the span of the semiconductor package 200 may entirely fall within the span of the cap 520. In some embodiments, the cap 520 may present regions of different thickness defining one or more curved regions CR10 in the portion of the cap 520 extending over the semiconductor package 200. For example, moving along the X direction in FIG. 4, the cap 520 may present a first thickness T1 at the joint between the cap 520 and the outer flanges 510. The thickness of the cap 520 may be changing (e.g., gradually reducing) until reaching a thickness T2, which may be reached in correspondence of one of the saddles of the warpage profile of the semiconductor package 200 (e.g., a region in which the rear surface 200r of the semiconductor package 200 reaches a local or absolute maximum in terms of level height along the Z direction). Proceeding even further along the X direction, the thickness of the cap 520 may change again (e.g., increase) until reaching the thickness T3 in correspondence of the region in between the two saddles of the warpage profile of the semiconductor package 200 (e.g., a region in which the rear surface 200r of the semiconductor package 200 reaches a local or absolute minimum in terms of level height along the Z direction in between two local maxima). From the thickness T3, the thickness of the cap 520 may change (e.g., decrease) to a thickness T4 in correspondence of the second saddle of the warpage profile of the semiconductor package 200, to then change again (e.g., increase) to reach the thickness T5 at the joint with the outer flanges 510. In some embodiments, the thicknesses T2 and T4 may be selected according to the overall size of the package. For example, larger thicknesses T2 and T4 may be selected for larger packages. In some embodiments, the thicknesses T2 and T4 may independently vary to accommodate semiconductor packages 200 of different sizes, for example when semiconductor packages 200 with different total height are stacked on the circuit substrate 200. In some embodiments, the thicknesses T2 and T4 may be approximately equal. In some embodiments, the thicknesses T2 and T4 may independently be about in the range from 0.5 mm to 5 mm. The thicknesses T1, T3, T5 may be selected so as to achieve the desired curvature, for example after the thicknesses T2 and T4 are chosen. In some embodiments, the thicknesses T1, T3, and T5 may independently be 0.6 to 40% greater than or smaller than the thickness T2 or T4, according to the warpage profile of the semiconductor package 200 and the circuit substrate 100.

That is, the bottom surface 520b of the cap 520 (which may be considered a part of the inner surface 500i of the metallic cover 500) presents a curved profile. In some embodiments, the bottom surface 520b may have a substantially complementary shape with respect to the rear surface 200r of the semiconductor package 200, so as to spatially fit the semiconductor package 200. For example, if the rear surface 200r presents a concavity, the bottom surface 520b may present a convexity, and vice versa. As illustrated in FIG. 4, in this example the curved region CR10 of the cap 520 extends on the semiconductor package 200 and also beside the semiconductor package 200, and presents concave regions CV11, CV12 in correspondence of the saddles of the semiconductor package 200, and a convex region CX10 in between the two concave regions CV11, CV12, in correspondence of the through in between the saddles. In some embodiments, the curved bottom surface 520b may be a ceiling of the enclosure formed by the metallic cover 500 and the circuit substrate 100. In some embodiments, the outer surface 520 out of the cap 520 may not present a designed curvature.

In some embodiments, the curvature of the bottom surface 520b may be designed so as to match the warpage profile of the semiconductor package 200. While a certain warpage profile is illustrated in the drawings, the disclosure is not limited thereto. For example, the curvature of the bottom surface 520b of the cap 520 is not limited to crying warp profiles. In some embodiments, the curvature profile may also include the smiling warp profile. In some embodiments, there may be both crying warp and smiling warp co-exist whenever multiple semiconductor packages 200 are mounted on one circuit substrate 100. In some embodiments, the warpage of the semiconductor package 200 may be measured after the semiconductor package 200 is bonded to the circuit substrate 100, or may be estimated from simulations of the manufacturing process. Naturally, the simulations results may be further refined or confirmed with warpage measurements during the manufacturing process. Before the attachment and during aligning the footprints of the metallic cover 500 and the circuit substrate 100, the curved profile of the bottom surfaces 520b of the cap 520 matches the warpage or warped profile of semiconductor package 200. In some embodiments, by including a cap 520 with a curved bottom surface 520b in the semiconductor device SD10, the contact between the cap 520 and the TIM 420 may be enhanced. For example, if the semiconductor SD10 is tested with ultrasounds, good contact of the metallic cover 500 with one or both of the adhesive 410 and the TIM 420 may be observed. In some embodiments, good contact between the cap 520 and the TIM 420 is observed along the edges of the semiconductor package 200, as well as in correspondence of depressed regions (throughs) in between raised regions (e.g., the two saddles in the semiconductor package 200). Furthermore, the contact area between the metallic cover 500 and the semiconductor package 200 may be approximately measured by interposing a pressure sensor in between the cap 520 and the semiconductor package 200 before assembly. In some embodiments, the effective contact area may increase when the cap 520 presents a curved bottom surface 520b. That is, the contact area of a curved cap 520 may be larger than the contact area obtained with a cap having a straight profile. In some embodiments, when a cap 520 having a curved bottom surface 520b is included, the overall thermal performance (as measured, for example, by the thermal resistance index) may be improved. For example, an area having lower thermal resistance may be wider than in the case in which the cap 520 does not present any curvature, and the thermal resistance at the edges and the corners of the semiconductor package 200 may also be lower. Because of the improved thermal performances, usage powers may be increased without significantly affecting performances or reliability of the semiconductor device SD10. In some embodiments, the inclusion of a curved cap 520 may not significantly affect the mechanical stability of the semiconductor device SD10, and some mechanical properties may even be improved. For example, reduced delamination of the adhesive 410 may be observed.

Figure 5:
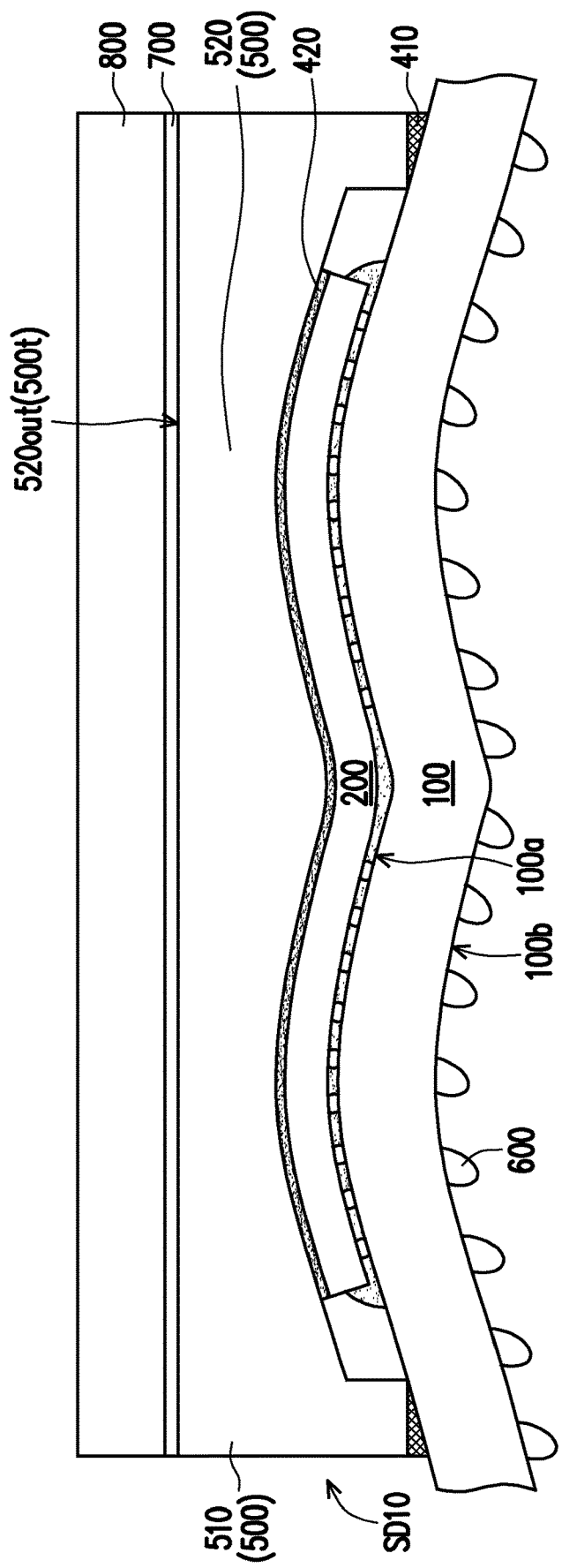
FIG. 5 is a schematic cross-sectional view of a semiconductor device integrated with additional components according to some embodiments of the disclosure.

In FIG. 5 is illustrated the semiconductor device SD10 integrated with additional components according to some embodiments of the disclosure. For example, connective terminals 600 may be installed on the side 100b of the circuit substrate 100 opposite to the side 100a to which the semiconductor package 200 is bonded. In some embodiments, the connective terminals 600 are solder balls for ball grid array mounts. In some embodiments, the connective terminals 600 are electrically connected to the semiconductor package 200 via the circuit substrate 100. In some embodiments, the connective terminals 600 may be used to integrate the semiconductor device SD10 with other devices. As illustrated in FIG. 5, in some embodiments, additional TIM 700 may be disposed on the outer surface 520 out of the cap 520. For example, the additional TIM 700 may cover the top surface 500t of the metallic cover 500. In some embodiments, the additional TIM 700 may extend over the entire top surface 500t (e.g., including over the outer flanges 510). In some embodiments, a heat dissipator 800 may be disposed on the additional TIM 700 to aid in dissipating heat generated during usage of the semiconductor device SD10. The type of heat dissipator 800 is not particularly limited, and may include water circulation systems, metallic heat plates, or the like, for example. It should be noted that while in the following disclosure the semiconductor devices may be presented without including connective terminals, additional TIM, or heat dissipators, the disclosure also includes embodiments in which these additional components are included for all of the semiconductor devices presented herein. Unless otherwise specified, the description of structures, materials and processes given above for the components of the semiconductor device SD10 applies to corresponding components of the other semiconductor devices of the disclosure.

Figure 6:
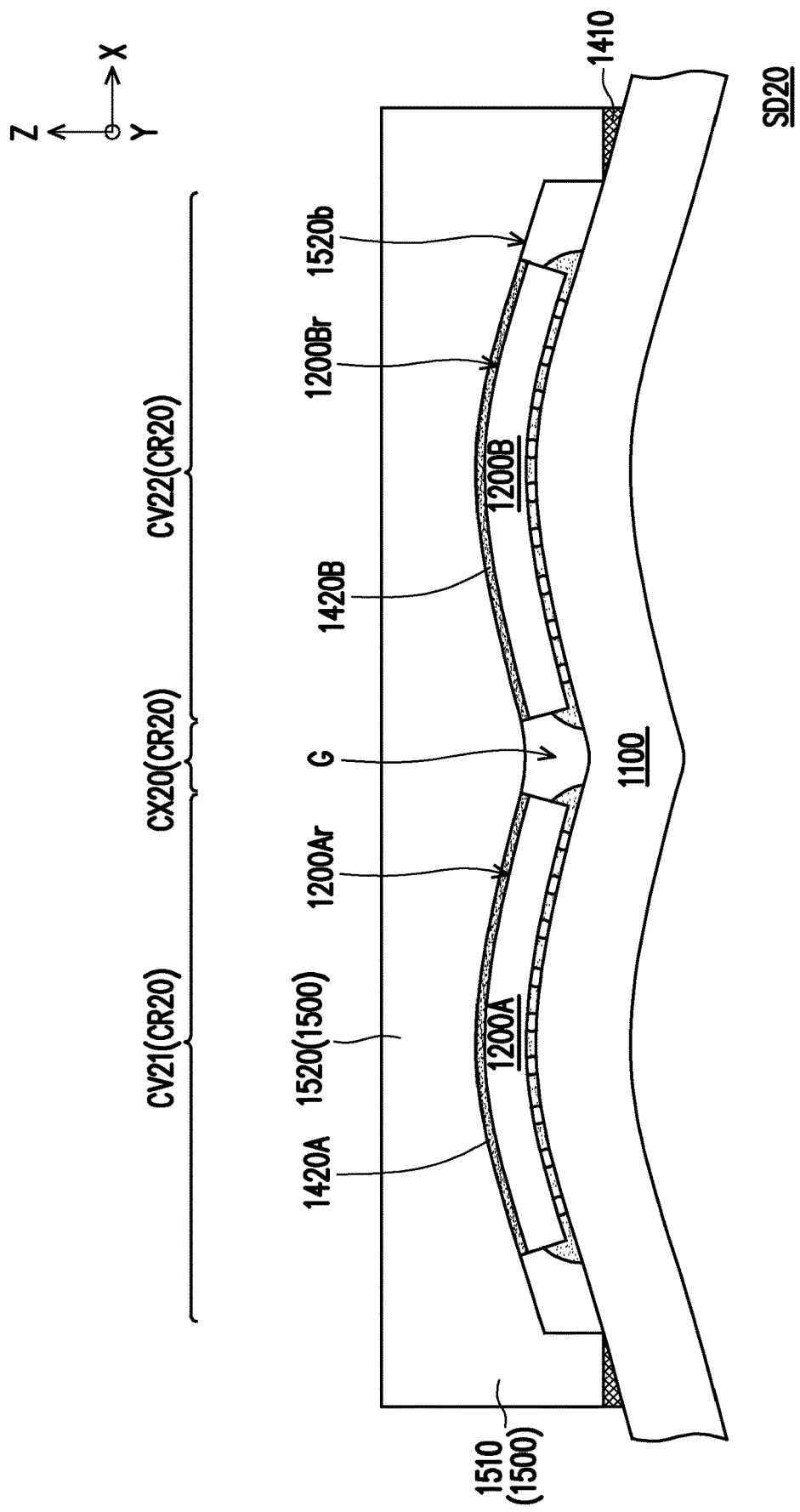

FIG. 6 is a schematic cross-sectional view of a semiconductor device SD20 according to some embodiments of the disclosure. In some embodiments, the semiconductor device SD20 has a similar structure and can be manufactured following similar processes as previously described with respect to the semiconductor device SD10 of FIG. 4. For example, the circuit substrate 1100 may have a similar structure as the circuit substrate 100 of FIG. 1, and each semiconductor packages 1200A, 1200B connected to the circuit substrate 1100 may have a similar structure as the semiconductor package 200 of FIG. 2A, and so on. As illustrated in FIG. 6, multiple semiconductor packages 1200A, 1200B are connected to the circuit substrate 1100. In some embodiments, the two semiconductor packages 1200A, 1200B have a single saddle-type warpage profile, while the circuit substrate 1100 has a double saddle-type warpage profile. In some embodiments, the semiconductor packages 1200A, 1200B are disposed in correspondence of the saddles of the circuit substrate 1100, and are separated from each other by a gap G in correspondence of the through in between the saddles of the circuit substrate 1100. Adhesive 1410 is disposed in proximity of the edges of the circuit substrate 1100, and TIMs 1420A, 1420B are respectively disposed on the rear surfaces 1200Ar, 1200Br of the semiconductor packages 1200A, 1200B. The metallic cover 1500 is secured to the circuit substrate 1100 by the adhesive 1410, and to the semiconductor packages 1200A, 1200B by the TIMs 1420A, 1420B. The metallic cover 1500 may have a structure similar to the metallic cover 500 of FIG. 4, with outer flanges 1510 contacting the adhesive around the semiconductor packages 1200A, 1200B, and a cap 1520 covering the semiconductor packages 1200A, 1200B. The cap 1520 has a curved bottom surface 1520b, so that a curved region lCR20 of the cap 1520 overlies the semiconductor packages 1200A, 1200B. In some embodiments, the curved region CR20 may include concave regions CV21, CV22 in correspondence of the semiconductor packages 1200A, 1200B, and a convex region CX20 in between the concave regions CV21, CV22 in correspondence of the gap G. As illustrated in FIG. 6, the concave regions CV21, CV22 may further extend from the semiconductor packages 1200A, 1200B to the outer flanges 1510. The curvature of the metallic cover 1500 may be determined according to the warpage profile of the semiconductor packages 1200A, 1200B after bonding to the circuit substrate 1100, similarly to what was previously described for the semiconductor device SD10 of FIG. 4. In some embodiments, because the semiconductor device SD20 includes a curved metallic cover 1500, the contact between the TIMs 1420A, 1420B and the cap 1520 may be enhanced, resulting in superior thermal performances of the semiconductor device SD20.

Figure 7:
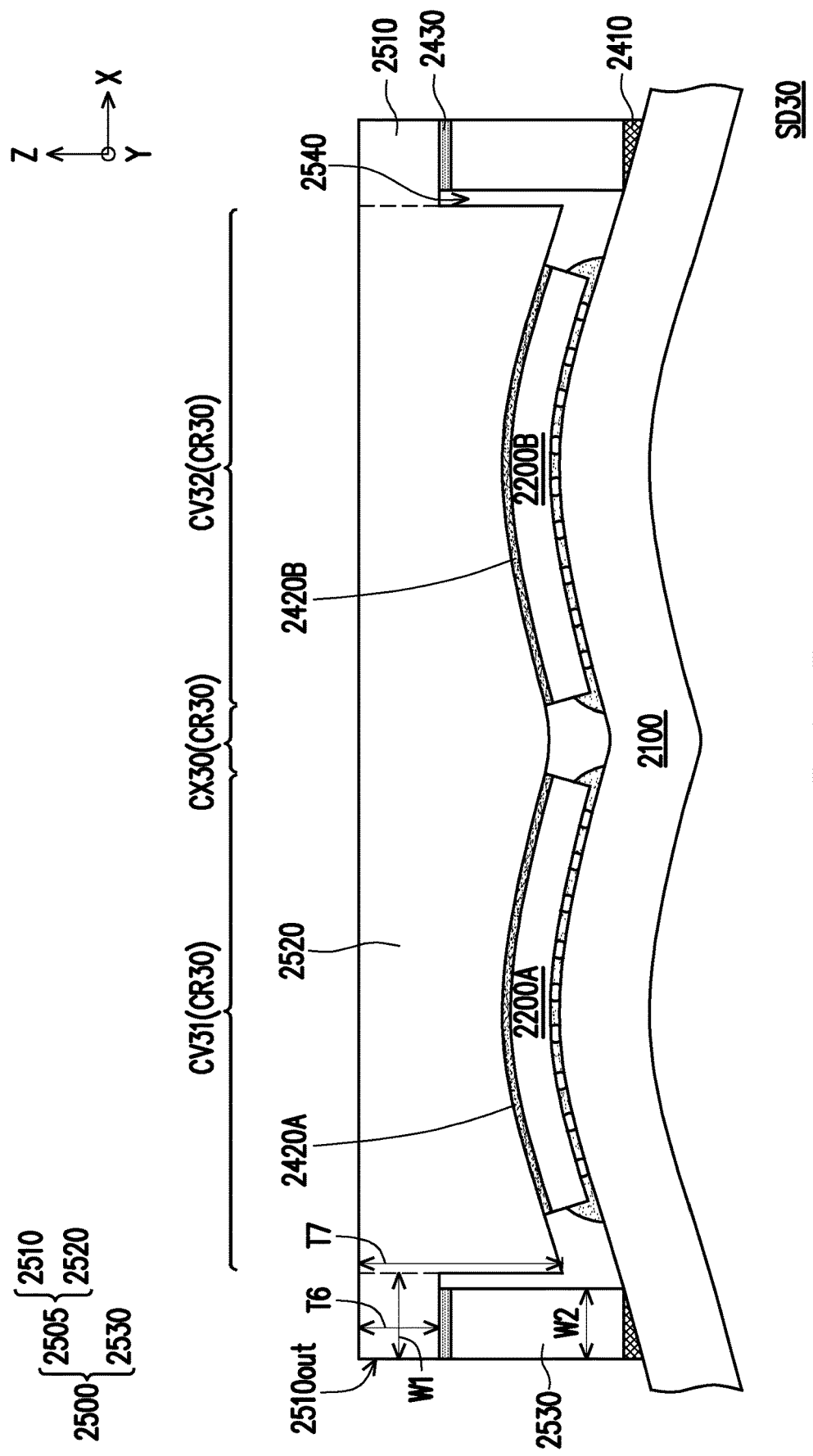

FIG. 7 is a schematic cross-sectional view of a semiconductor device SD30 according to some embodiments of the disclosure. In some embodiments, the semiconductor device SD30 has a similar structure and can be manufactured following similar processes as previously described with respect to the semiconductor device SD20 of FIG. 6. In some embodiments, the semiconductor device SD30 includes the circuit substrate 2100 having one or more semiconductor packages 2200A, 2200B attached thereto, and a metallic cover 2500 secured by adhesive 2410 and TIMs 2420A, 2420B. In some embodiments, the metallic cover 2500 includes the outer flanges 2510 and the cap 2520 integrally formed as the cover block 2505, and a support 2530. In some embodiments, the support 2530 may be an annular structure secured to the circuit substrate 2100 by the adhesive 2410. In some embodiments, the support 2530 may include a same material as the cover block 2505. In some alternative embodiments, the material of the support 2530 may be different from the material of the cover block 2505. In some embodiments, the support 2530 may include stainless steel, silicon carbide alloy, machinable ceramic, dummy silicon, kovar, invar, copper alloys, molybdenum, copper- or nickel-clad molybdenum, copper-clad Invar, copper tungsten, aluminum, diamond composites (e.g, metal diamond alloys such as silver diamond) or a combination thereof. In some embodiments, the material of the support 2530 and the material of the cover block 2505 including the cap 2520 and the outer flanges 2510 may be selected to achieve desired mechanical or thermal properties for the metallic cover 2500. For example, the material of the support 2530 may be selected to have high elastic modulus and low CTE such as covar, invar, metal-diamond composites (e.g., silver-, aluminum- or copper-diamond), molybdenum and/or its copper alloys, tungsten silicon carbide, etc. In some embodiments, the material of the cover block 2505 may be selected so as to have high thermal conductivity and low elastic modulus. For example, the cover block 2505 may include a metal-diamond composite material, in which a diamond phase is distributed in a metal matrix, where the metal may be silver, copper, aluminum or the like, for example. In some embodiments, the elastic modulus of the diamond composite materials may be tuned by selection of the metal for the metal matrix and by adjusting the diamond content.

In some embodiments, a rubber seal 2430 may be disposed between the support 2530 and the outer flanges 2510 to maintain adequate contact between the outer flanges 2510 and the support 2530. A material of the rubber seal 2430 is not particularly limited, and may be selected as a function of properties such as elasticity and wear resistance. For example, silicone-based rubber resisting temperatures in the range from −40° C. to 300° C. may be used. In some embodiments, the cover block 2505 including the cap 2520 and the outer flanges 2510 may be considered a lid disposed on the support 2530 and the semiconductor packages 2200A, 2200B. That is, in the metallic cover 2500, the outer flanges 2510 land on the support 2530 through the rubber seal 2430, and the support 2530 is interposed between the outer flanges 2510 and the circuit substrate 2100. The cap 2520 presents a curved region CR30 of variable thickness over the semiconductor packages 2200A, 2200B in between the outer flanges 2510. The curved region CR30 may include one or more concave regions CV31, CV32 and one or more convex regions CX30, depending on the warpage profile of the semiconductor packages 2200A, 2200B and the circuit substrate 2100. In some embodiments, the outer flanges 2510 are integrally formed with the cap 2520 and have a substantially constant thickness T6 along the Z direction over the support 2530. In some embodiments, the width W1 of the outer flanges 2510 in a direction perpendicular to the outer surface 2510 out of the outer flanges 2510 (e.g., along the X direction in the view of FIG. 7) is greater than the width W2 of the underlying support 2530 along the same direction. In some embodiments, the cap 2520 presents a thickness T7 greater than the thickness T6 at the beginning of the curved region CR30 at the joint with the outer flanges 2510. That is, the cap 2520 and the outer flanges 2510 form a recess 2540 in which the support 2530 and the rubber seal 2430 are received. A small portion of the recess 2540 may remain to separate the support 2530 from the cap 2520 after the cap 2520 is disposed on the support 2530. In some embodiments, by including a metallic cover 2500 formed of multiple pieces (e.g., in this case, the support 2530 and the cover block 2505) it is possible to access the semiconductor packages 2200A, 2200B or the TIMs 2420A, 2420B if required, and also to replace the cover block 2505 of the metallic cover 2500 if needed. Furthermore, because the cap 2520 has a curved profile matching the warpage of the semiconductor packages 2200A, 2200B, the thermal performance of the semiconductor device SD30 may be enhanced.

Figure 8:
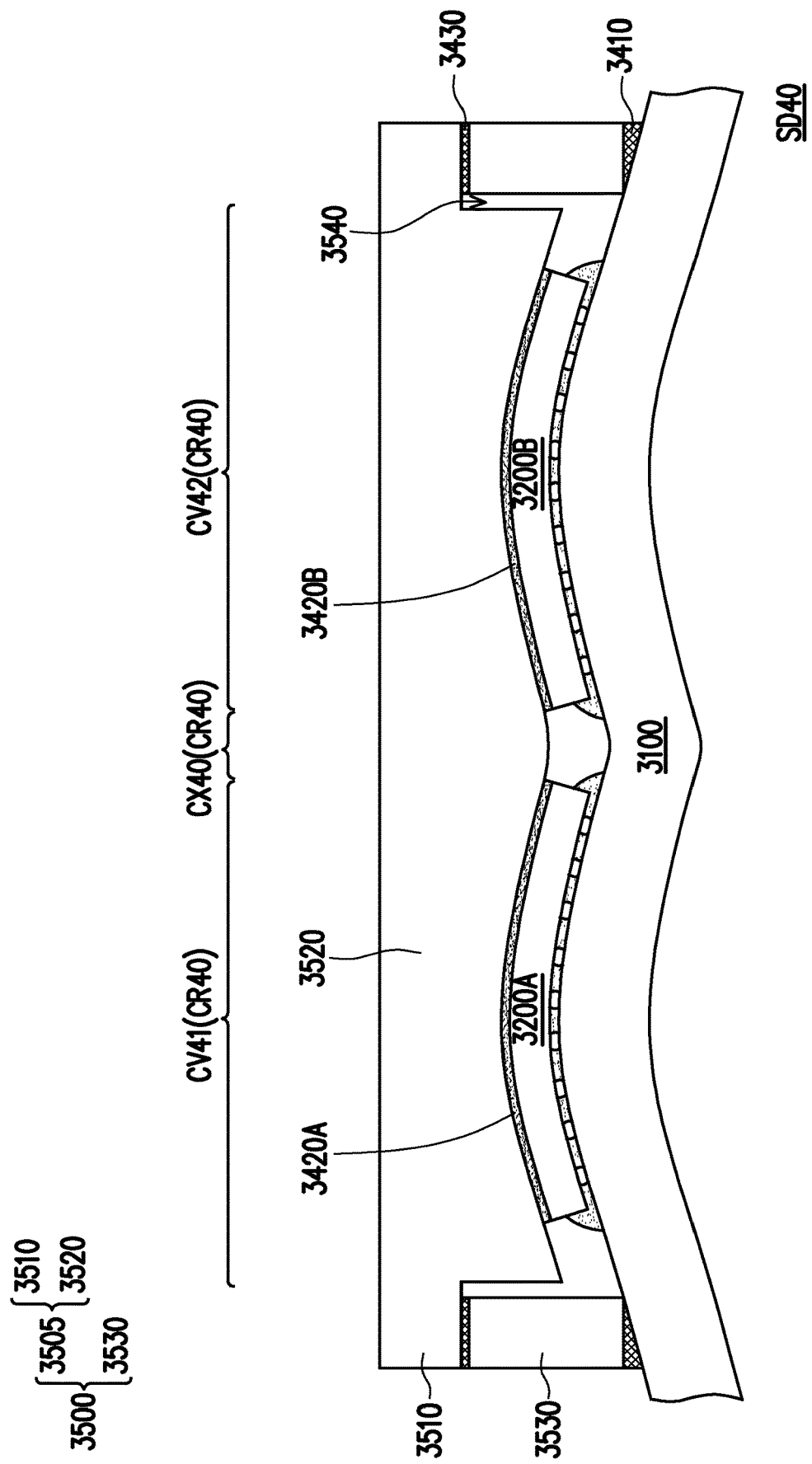

FIG. 8 is a schematic cross-sectional view of a semiconductor device SD40 according to some embodiments of the disclosure. In some embodiments, the semiconductor device SD40 has a similar structure and can be manufactured following similar processes as previously described with respect to the semiconductor device SD30 of FIG. 7. In some embodiments, the semiconductor device SD40 includes the circuit substrate 3100 having one or more semiconductor packages 3200A, 3200B bonded thereto, and a metallic cover 3500 secured by adhesive 3410 and TIMs 3420A, 3420B. In some embodiments, the metallic cover 3500 is composed of multiple pieces, similar to the metallic cover 2500 of FIG. 7. For example, the metallic cover 3500 includes cover block 3505 including the outer flanges 3510 integrally formed with the cap 3520, and, as a separate piece, the support 3530. The cap 3520 presents a curved region CR40 of variable thickness over the semiconductor packages 3200A, 3200B in between the outer flanges 3510. The curved region CR40 may include one or more concave regions CV41, CV42 and one or more convex regions CX40, depending on the warpage profile of the semiconductor packages 3200A, 3200B and the circuit substrate 3100. In some embodiments, a difference between the semiconductor package SD40 and the semiconductor package SD30 of FIG. 7 lies in that the cap 3520 and the outer flanges 3510 are secured to the support 3530 by an adhesive 3430. A material of the adhesive 3430 is not particularly limited, and may be selected from similar options as discussed above for the adhesive 410 (illustrated, e.g., in FIG. 3). In some embodiments, by securing the cover block 3505 to the support 3530 via the adhesive 3430, the mechanical stability of the semiconductor device SD40 may be enhanced. Furthermore, because the cap 3520 has a curved profile matching the warpage of the semiconductor packages 3200A, 3200B, the thermal performance of the semiconductor device SD40 may be enhanced.

Figure 9:
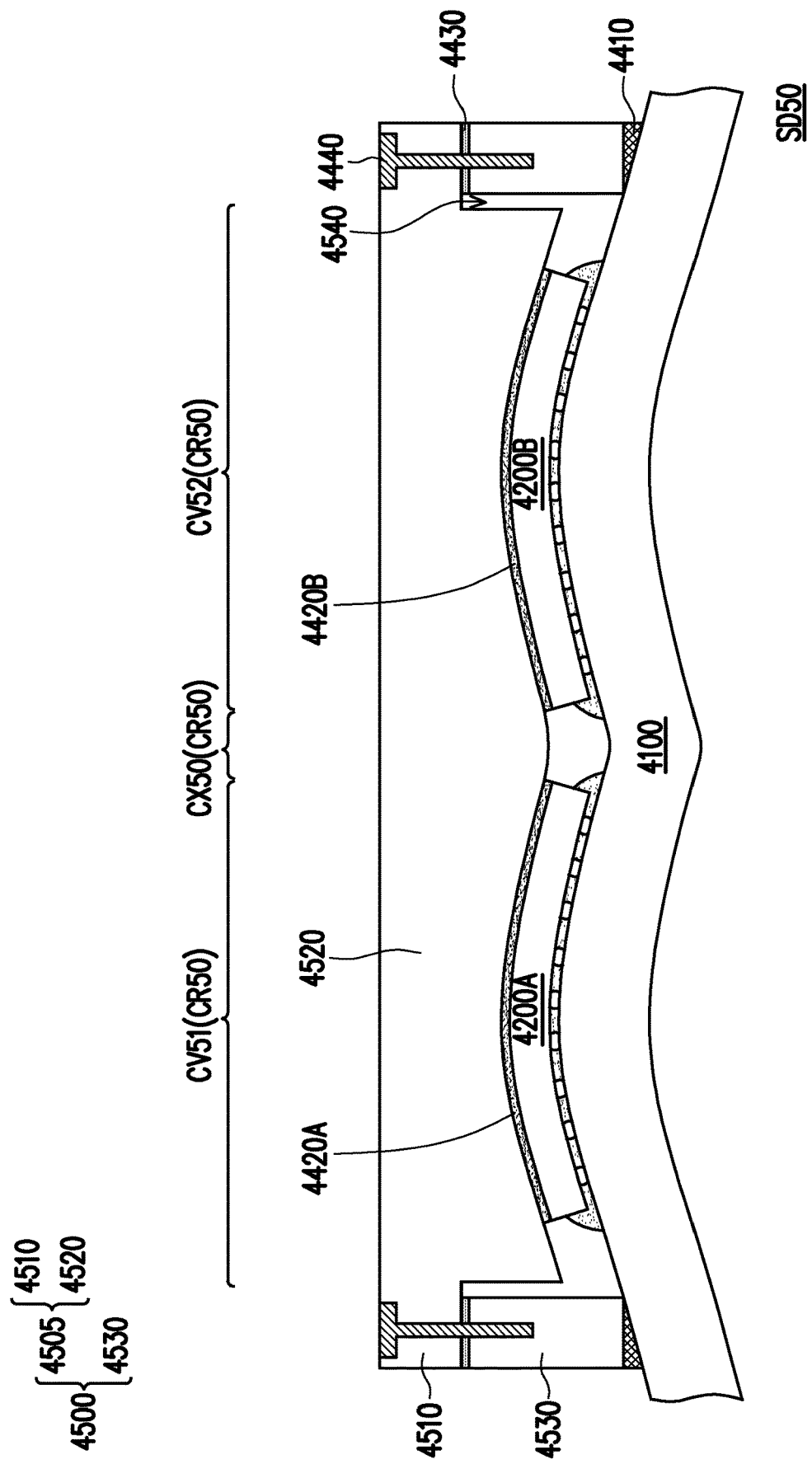

FIG. 9 is a schematic cross-sectional view of a semiconductor device SD50 according to some embodiments of the disclosure. In some embodiments, the semiconductor device SD50 has a similar structure and can be manufactured following similar processes as previously described with respect to the semiconductor device SD30 of FIG. 7. In some embodiments, the semiconductor device SD50 includes the circuit substrate 4100 having one or more semiconductor packages 4200A, 4200B bonded thereto, and a metallic cover 4500 secured by adhesive 4410 and TIMs 4420A, 4420B. In some embodiments, the metallic cover 4500 is composed of multiple pieces, similar to the metallic cover 2500 of FIG. 7. For example, the metallic cover 4500 includes cover block 4505 including the outer flanges 4510 integrally formed with the cap 4520, and, as a separate piece, the support 4530. The cap 4520 presents a curved region CR50 of variable thickness over the semiconductor packages 4200A, 4200B in between the outer flanges 4510. The curved region CR50 may include one or more concave regions CV51, CV52 and one or more convex regions CX50, depending on the warpage profile of the semiconductor packages 4200A, 4200B and the circuit substrate 4100. In some embodiments, a difference between the semiconductor package SD50 and the semiconductor package SD30 of FIG. 7 lies in that the cover block 4505 are secured to the support 4530 by screws 4440 or other fasteners (e.g., bolts or the like) extending through the outer flanges 4510 and the rubber seal 4430 to be received in the support 4530. In some embodiments, by securing the cover block 4505 to the support 4530 via screws 4440 in addition to the rubber seal 4430, the mechanical stability of the semiconductor device SD50 may be enhanced while preserving the possibility of accessing the semiconductor packages 4200A, 4200B or replacing the cover block 4505. Furthermore, because the cap 4520 has a curved profile matching the warpage of the semiconductor packages 4200A, 4200B, the thermal performance of the semiconductor device SD50 may be enhanced.

Figure 10A:
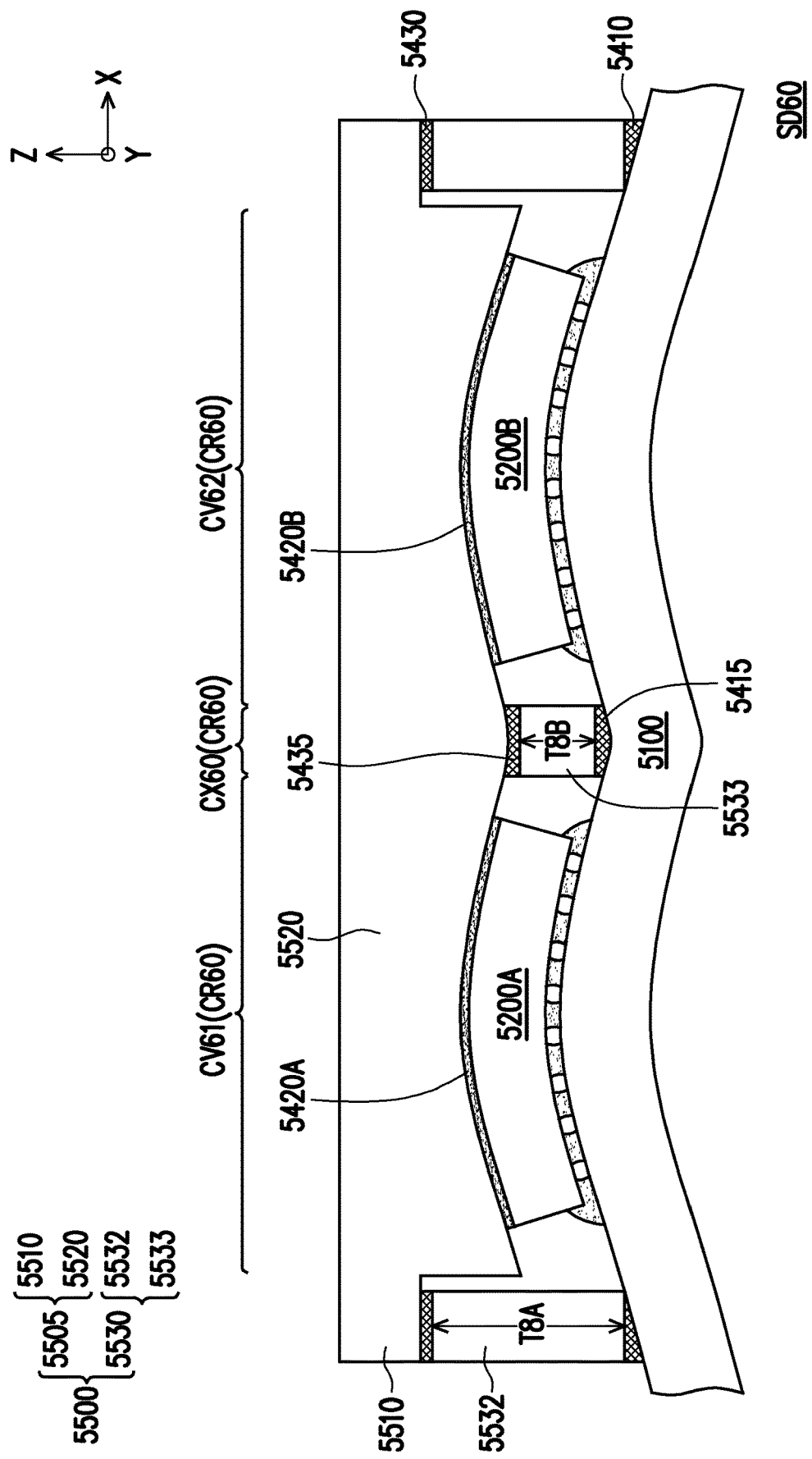

FIG. 10A is a schematic cross-sectional view of a semiconductor device SD60 according to some embodiments of the disclosure. In some embodiments, the semiconductor device SD60 has a similar structure and can be manufactured following similar processes as previously described with respect to the semiconductor device SD40 of FIG. 8. In some embodiments, the semiconductor device SD60 includes the circuit substrate 5100 having one or more semiconductor packages 5200A, 5200B bonded thereto, and a metallic cover 5500 secured by the adhesive 5410 and TIMs 5420A, 5420B. In some embodiments, the metallic cover 5500 is composed of multiple pieces, similar to the metallic cover 3500 of FIG. 8. For example, the metallic cover 5500 includes a cover block 5505 having the outer flanges 5510 integrally formed with the cap 5520, and, as a separate piece, the support 5530. The cap 5520 presents a curved region CR60 of variable thickness over the semiconductor packages 5200A, 5200B in between the outer flanges 5510. The curved region CR60 may include one or more concave regions CV61, CV62 and one or more convex regions CX60, depending on the warpage profile of the semiconductor packages 5200A, 5200B and the circuit substrate 5100.

Figure 10B:
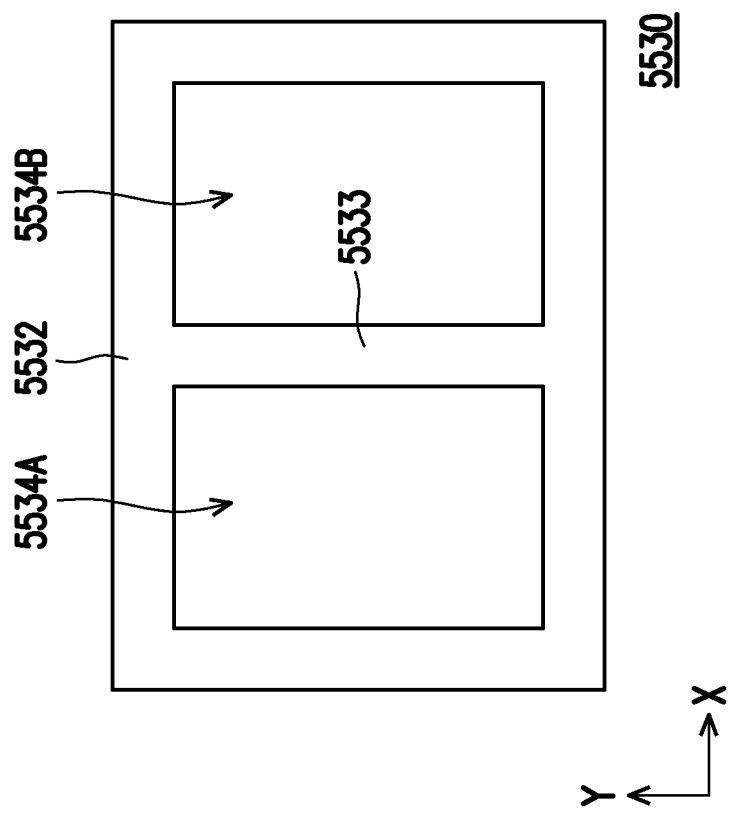
FIG. 10B and FIG. 10C are schematic top views of supports according to some embodiments of the disclosure.
Figure 10C:
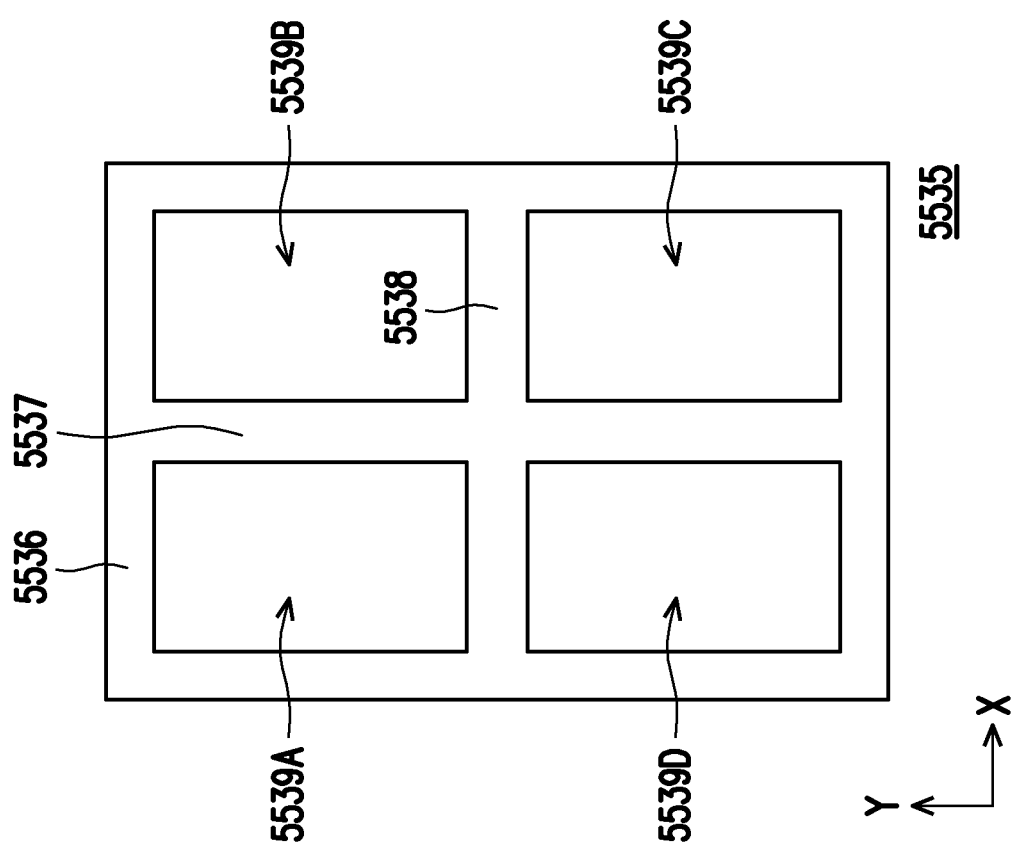

FIG. 10B is a schematic top view of the support 5530 according to some embodiments of the disclosure. Referring to FIG. 10A and FIG. 10B, in some embodiments the support 5530 includes an outer frame 5532 extending along the edge of the circuit substrate 5100, and a rib 5533 extending in between the semiconductor packages 5200A, 5200B. In some embodiments, the rib 5533 connects opposite edges of the frame 5532. For example, when the semiconductor device SD60 includes two semiconductor packages 5200A, 5200B, the frame 5532 and the rib 5533 may define two enclosures 5534A, 5534B in which the semiconductor packages 5200A, 5200B are disposed, for example one semiconductor package 5200A or 5200B per enclosure 5534A, 5534B. However, the disclosure is not limited thereto, and in some alternative embodiments, multiple semiconductor packages 5200A, 5200B may be disposed within the same enclosure. In some embodiments, the rib 5533 may be located in correspondence of the convex region CX60 of the cap 5520, in the through of the circuit substrate 5100 in between the warpage saddles. In some embodiments, the thickness T8A along the Z direction of the frame 5532 may be different from the thickness T8B of the rib 5533, to compensate for the warpage profile of the circuit substrate 5100. In some embodiments, the thicknesses T8A and T8B may be about in the range from 0.5 mm to 3 mm. In some embodiments, the adhesives 5410, 5430 are located below and above the frame 5532 to secure the support 5530 to the circuit substrate 5100 and the cover block 5505, respectively, an additional portion of adhesive 5415 may secure the rib 5533 to the circuit substrate 5100, and another portion of adhesive 5435 may secure the cap 5520 to the rib 5533. In some embodiments, the number of ribs 5533 is not limited to one. For example, as illustrated in the top view of FIG. 10C, a support 5535 may include two ribs 5537, 5538 connected to the frame 5536. In some embodiments, one rib 5537 connects a pair of opposite sides of the frame 5536 along a first direction (e.g., the Y direction), and the other rib 5538 may connect the other pair of opposite sides of the frame 5536 along a second direction (e.g., the X direction), thus forming four enclosures 5539A-5539D. The crossing point of the ribs 5537, 5538 may be determined based on considerations of mechanical stability and the footprint of the semiconductor packages 5200A, 5200B. In some alternative embodiments, the ribs 5537, 5538 may extend along the same direction, forming a series of parallel enclosures. In some embodiments, by including a support 5530 or 5535 having one or more ribs 5533, 5537, 5538, the mechanical stability of the semiconductor device SD60 may be enhanced. For example, the ribs 5533, 5537, 5538 may provide additional protection against mechanical deformation. In some embodiments, adhesion of the cap 5520 and thermal dissipation properties may also be improved.

Figure 11A:
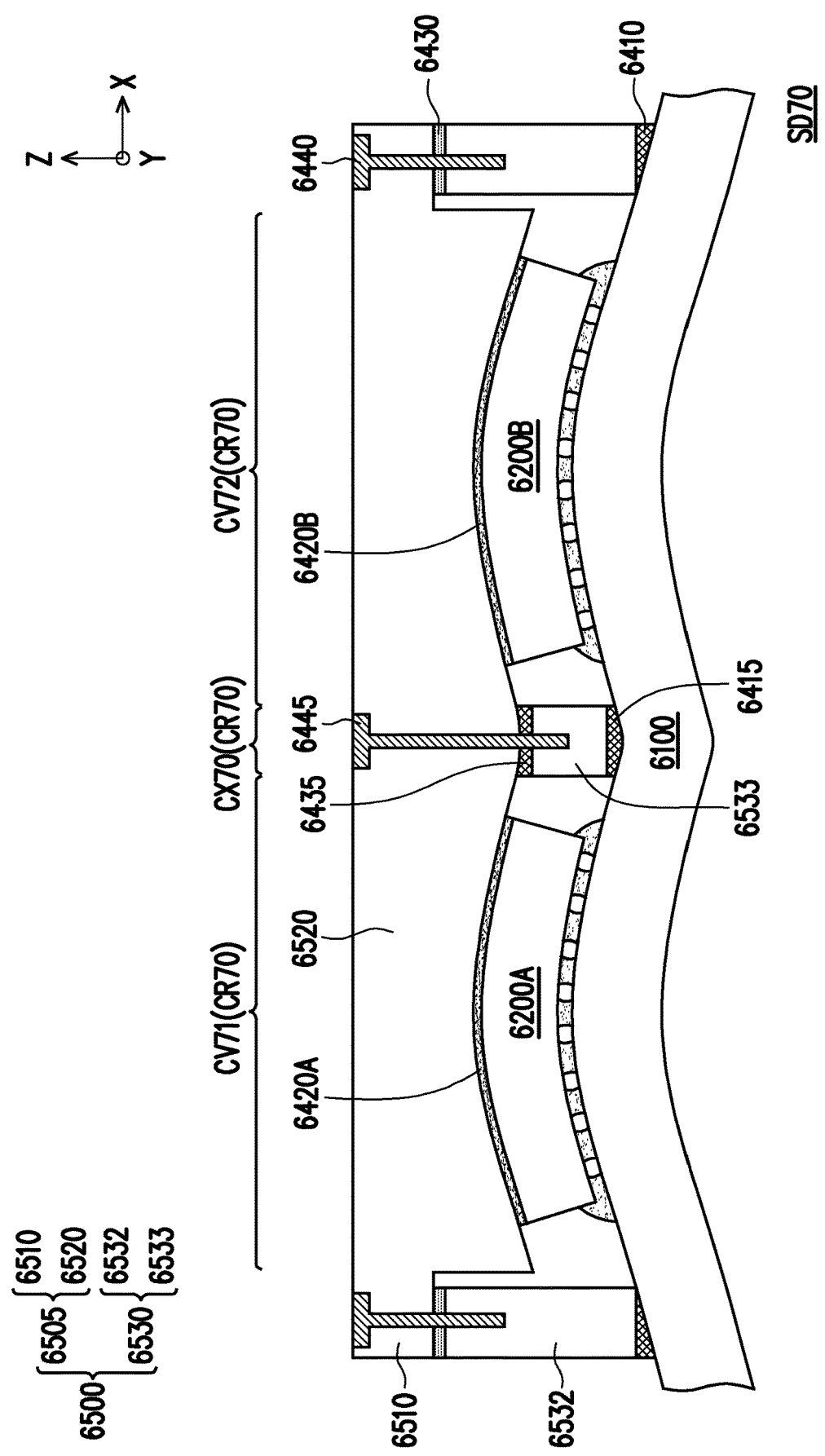
FIG. 11A is a schematic cross-sectional view of a semiconductor device according to some embodiments of the disclosure.
Figure 11B:
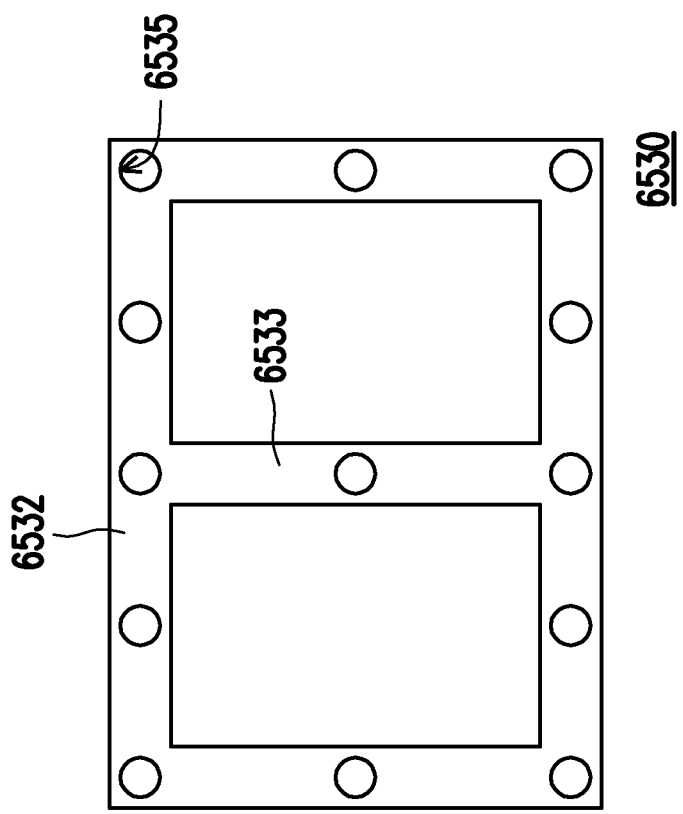
FIG. 11B is a schematic top view of a support according to some embodiments of the disclosure.

FIG. 11A is a schematic cross-sectional view of a semiconductor device SD70 according to some embodiments of the disclosure. FIG. 11B is a schematic top view of a support 6530 according to some embodiments of the disclosure. Referring to FIG. 11A and FIG. 11B, in some embodiments, the semiconductor device SD70 has a similar structure and can be manufactured following similar processes as previously described with respect to the semiconductor device SD50 of FIG. 9. In some embodiments, the semiconductor device SD70 includes the circuit substrate 6100 having one or more semiconductor packages 6200A, 6200B bonded thereto, and a metallic cover 6500 secured by the adhesives 6410, 6415 and TIMs 6420A, 6420B. In some embodiments, the metallic cover 6500 is composed of multiple pieces, similar to the metallic cover 5500 of FIG. 10A. For example, the metallic cover 6500 includes cover block 6505 including the outer flanges 6510 integrally formed with the cap 6520, and, as a separate piece, the support 6530. The cap 6520 presents a curved region CR70 of variable thickness over the semiconductor packages 6200A, 6200B in between the outer flanges 6510. The curved region CR70 may include one or more concave regions CV71, CV72 and one or more convex regions CX70, depending on the warpage profile of the semiconductor packages 6200A, 6200B and the circuit substrate 6100. The support 6530 may include an outer frame 6532 and one or more ribs 6533, similar to the supports 5530 or 5535 of FIG. 10B and FIG. 10C. In some embodiments, the upper piece of the metallic cover 6500 including the cap 6520 and the outer flanges 6510 may be secured to the support 6530 by a rubber seal 6430 disposed along the outer frame 6532 and adhesive 6435 disposed in correspondence of the one or more ribs 6533. Furthermore, screws 6440, 6445 (or other fasteners such as bolts) may be included extending through the outer flanges 6510 and the rubber seal 6430 or through the cap 6520 and the adhesive 6435 to be received in blind holes 6535 formed in the support 6530, to provide additional mechanical stability. In some embodiments, screws 6440, 6445 of different lengths may be used to compensate for the curved profile of the cap 6520. For examples, shorter screws 6440 may be used on the outer flanges 6510 where the outer frame 6532 is located, while longer screws 6445 may be used in correspondence of the ribs 6533 when the ribs 6533 are formed in correspondence of the convex region(s) CX70 of the cap 6520. In general, the length of the screws 6440, 6445 may be selected taking into account the thickness along the Z direction of the cap 6520, which, in turn, is selected according to the warpage profile of the semiconductor packages 6200A, 6200B and the circuit substrate 6100.

Figure 12:
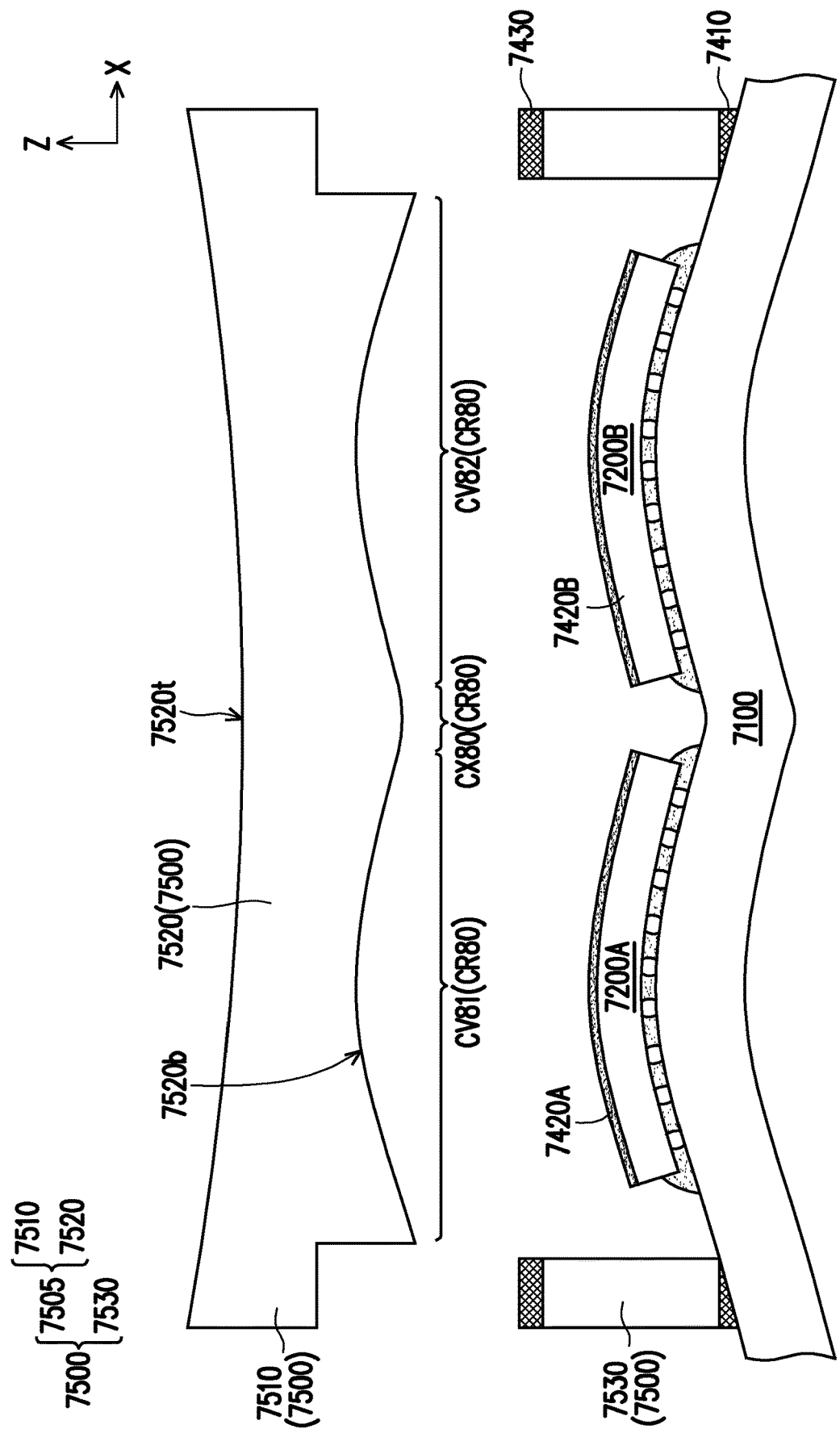
FIG. 12 is a schematic cross-sectional view of a structure formed during a manufacturing process of a semiconductor device according to some embodiments of the disclosure.

FIG. 12 is a cross-sectional view of a structure formed during a manufacturing step of a semiconductor device SD80 (illustrated, e.g., in FIG. 13) according to some embodiments of the disclosure. The structure of FIG. 12 may be obtained following similar manufacturing processes as previously described. Briefly, one or more semiconductor packages 7200A, 7200B and the support 7530 are bonded to the circuit substrate 7100. The support 7530 may be secured to the circuit substrate 7100 by the adhesive 7410, and additional adhesive 7430 may be disposed on the support 7530 to secure the outer flanges 6510 of the cover block 7505. TIMs 7420A, 7420B are disposed on the semiconductor packages 7200A, 7200B. In FIG. 12 the cap 7520 and the outer flanges 7510 are illustrated before assembly to the support 7530. As illustrated in FIG. 12, the bottom surface 7520b of the cap 7520 presents a curved profile, including one or more concave regions CV81, CV82 and one or more convex regions CX80, defining the curved region CR80 over the semiconductor packages 7200A, 7200B. In some embodiments, the top surface 7520t of the cap 7520 opposite to the bottom surface 7520b also presents a curved profile. In some embodiments, when the top surface 7520t before bonding is flat, some mechanical stress generated during bonding may result in an uneven profile of the top surface 7520t. In some embodiments, the curvature of the top surface 7520t may be designed so as to compensate for unevenness of the top surface 7520t remaining after the cap 7520 is secured to the semiconductor packages 7200A, 7200B. In some embodiments, the curvature of the top surface 7520t extends also over the outer flanges 7510. In some embodiments, the residual curvature after bonding of the top surface 7520t may be measured during the manufacturing process, and a metallic cover 7500 with a curved top surface 7520t may be fabricated to compensate for such residual curvature. In some alternative embodiments, the residual curvature may be estimated from simulations of the manufacturing process, and this estimate may be used to determine the initial curvature of the top surface 7520t so that, after bonding, the residual curvature is reduced, minimized, or flattened.

Figure 13:
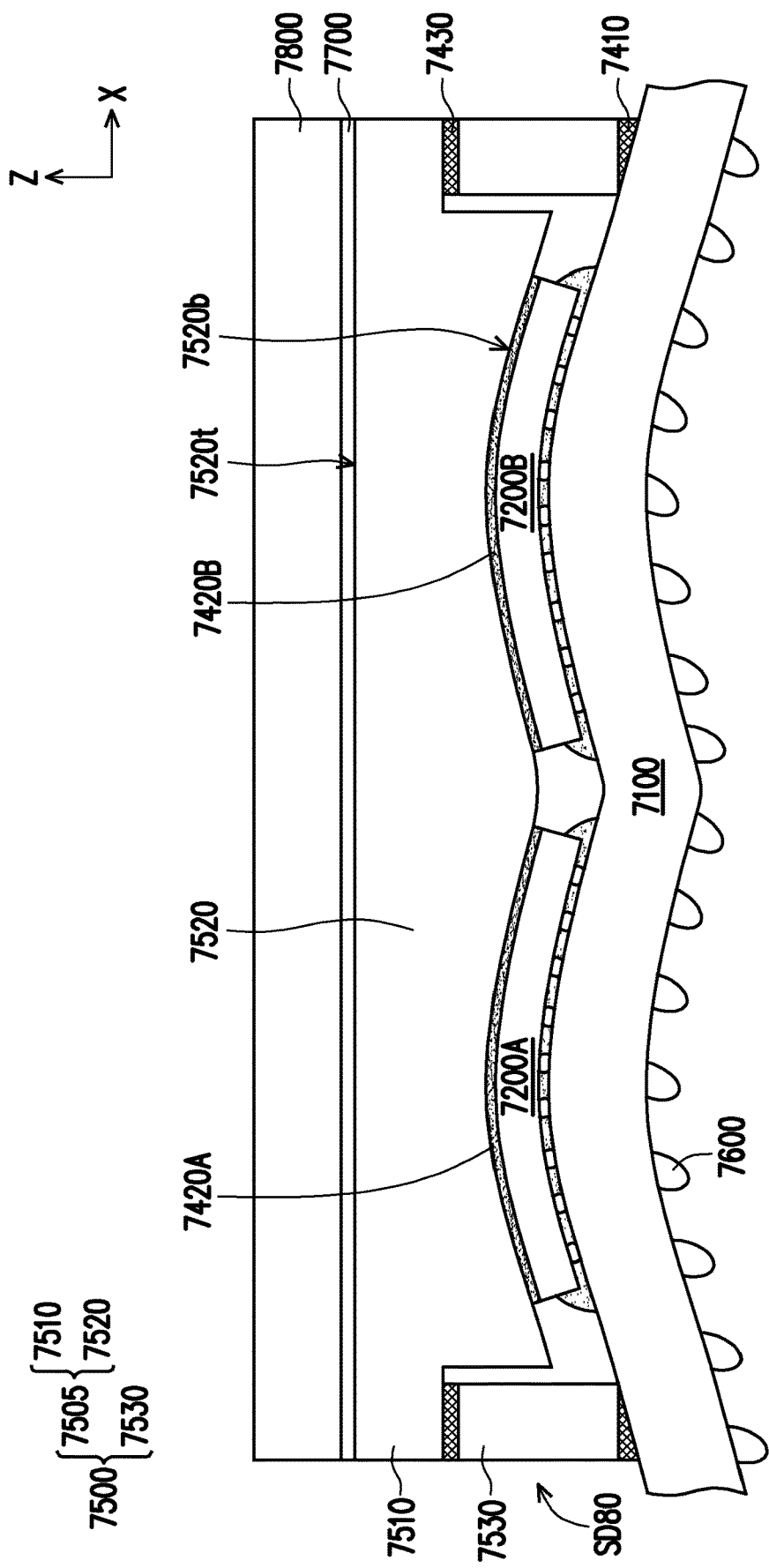
FIG. 13 is a schematic cross-sectional view of a semiconductor device integrated with additional components according to some embodiments of the disclosure.

In FIG. 13 is illustrated the semiconductor device SD80 integrated with additional components according to some embodiments of the disclosure. For example, connective terminals 7600 may be installed on the circuit substrate 7100 on the opposite side of the semiconductor packages 7200A, 7200B. Furthermore, additional TIM 7700 is disposed on the outer surface 7520t of the cap 7520, possibly all over the cover block 7505, and a heat dissipator 7800 may be disposed on the additional TIM 7700 to aid in dissipating heat generated during usage of the semiconductor device SD80. In some embodiments, the increased flatness of the top surface 7520t may be particularly suited for use with a film-type material as the TIM 7700, thus enhancing the thermal exchange between the metallic cover 7500 and the heat dissipator 7800.

Figure 14A:
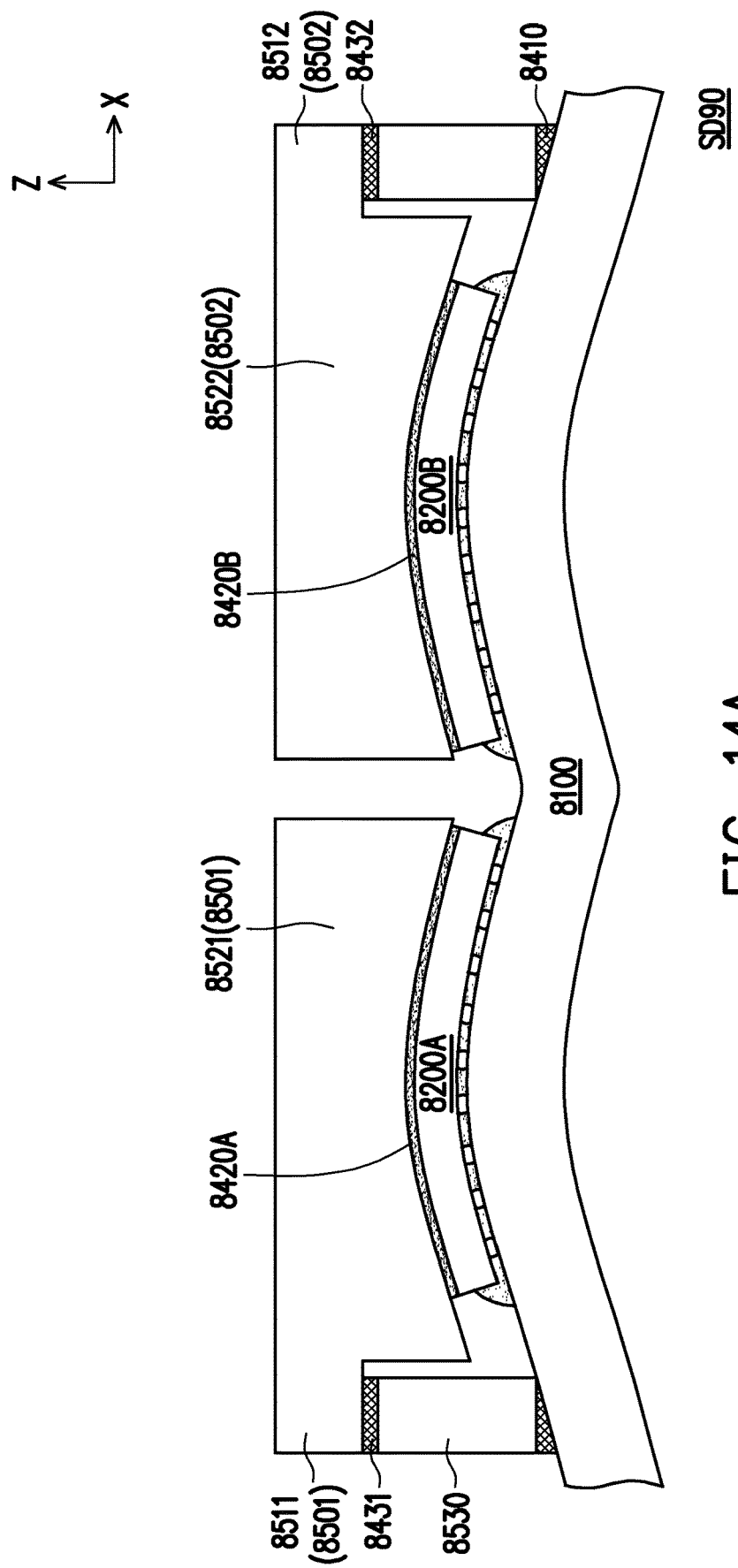
FIG. 14A is a schematic cross-sectional view of a semiconductor device according to some embodiments of the disclosure.
Figure 14B:
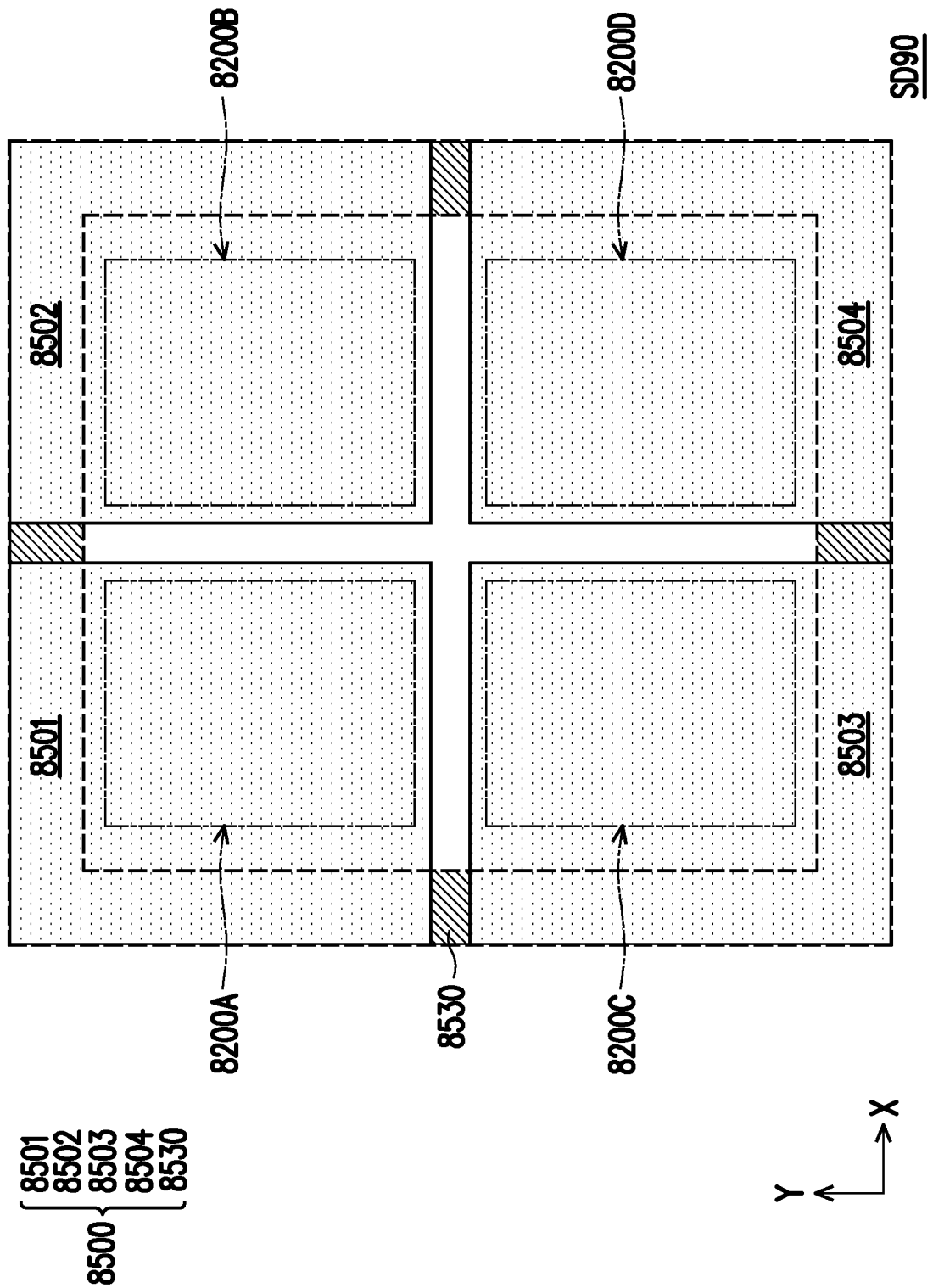
FIG. 14B is a schematic top view of a semiconductor device according to some embodiments of the disclosure.

FIG. 14A is a schematic cross-sectional view of a semiconductor device SD90 according to some embodiments of the disclosure. FIG. 14B is a schematic top view of the semiconductor device SD90 according to some embodiments of the disclosure. Referring to FIG. 14A and FIG. 14B, in some embodiments, the semiconductor device SD90 has a similar structure and can be manufactured following similar processes as previously described with respect to the semiconductor device SD40 of FIG. 8. In some embodiments, the semiconductor device SD90 includes the circuit substrate 8100 having one or more semiconductor packages 8200A, 8200B bonded thereto, and a metallic cover 8500 secured by the adhesives 8410 and TIMs 8420A, 8420B. In some embodiments, the metallic cover 8500 is composed of multiple pieces, including multiple cover blocks 8501-8504 and a support 8530. In some embodiments, the support 8530 is similar to the support 3530 of FIG. 8, including an annular frame at the edge of the circuit substrate 8100. In some embodiments, each one of the cover blocks 8501-8504 includes outer flanges (e.g., 8511, 8512) and a corresponding cap (e.g., 8521, 8522) integrally formed. The outer flanges (e.g., 8511, 8512, etc.) of the cover blocks 8501-8504 are secured to the support 8530 by portions of adhesive (e.g., 8431, 8432, etc.). The caps (e.g., 8521, 8522, etc.) extend over the semiconductor packages 8200A-8200D. For example, the metallic cover 8500 may include as many cover blocks 8501-8504 as there are semiconductor packages 8200A-8200D, but the disclosure is not limited thereto. In some embodiments, a cover block may extend over multiple semiconductor packages 8200. In some embodiments, portions of the support 8530 may be left uncovered by the cover blocks 8501-8504. That is, the cover blocks 8501-8504 may be disposed with small gaps in between each other. In some alternative embodiments, the cover blocks 8501-8504 may be in direct contact with each other. In some embodiments, the portions of the circuit substrate 8100 may be left uncovered by the cover blocks 8501-8504. For example, as illustrated in FIG. 14A, the cover block 8501 may be disposed on the semiconductor package 8200A, the cover block 8502 may be disposed on the semiconductor package 8200B, and neither of the cover block 8501 or 8502 (or the other cover blocks 8503, 8504) may extend on the through in between the warpage saddles of the circuit substrate 8100. In some embodiments, each one of the cover blocks 8501-8504 is designed with a curved profile to match the warpage of the corresponding underlying semiconductor package 8200A-8200D. In some embodiments, by including different cover blocks 8501-8504 for different semiconductor packages 8200A-8200D (for example, one cover block 8501-8504 per semiconductor package 8200A-8200D) the design and manufacturing of the metallic cover 8500 may be simplified, and the curvature of the individual cover blocks 8501-8504 may better follow the warpage profile of the semiconductor packages 8200A-8200D and the circuit substrate 8100, thus increasing the conformal contact with the TIMs (e.g., 8420A, 8420B, etc.) disposed on the semiconductor packages 8200A-8200D.

Figure 15A:
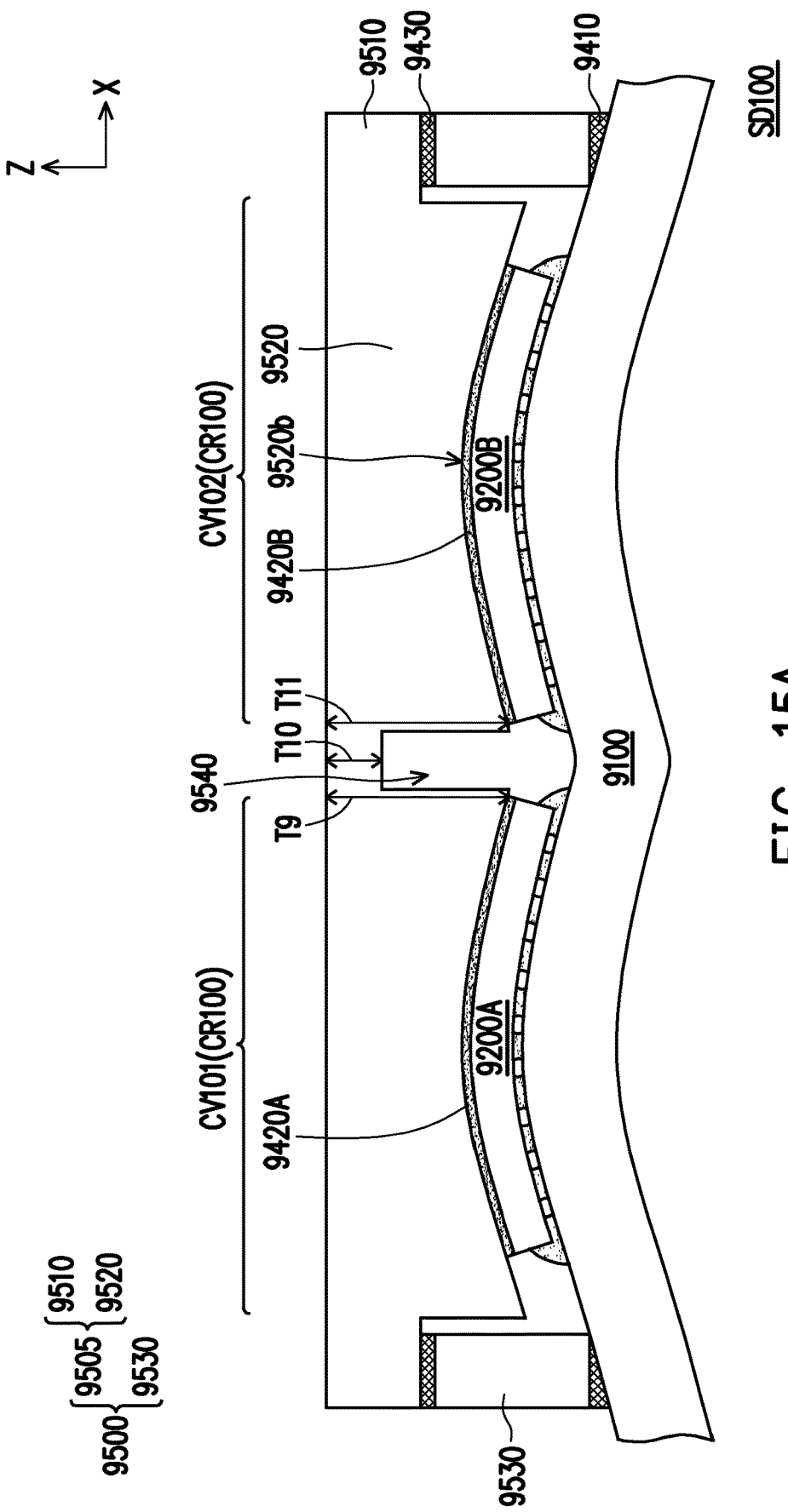
FIG. 15A is a schematic cross-sectional view of a semiconductor device according to some embodiments of the disclosure.
Figure 15B:
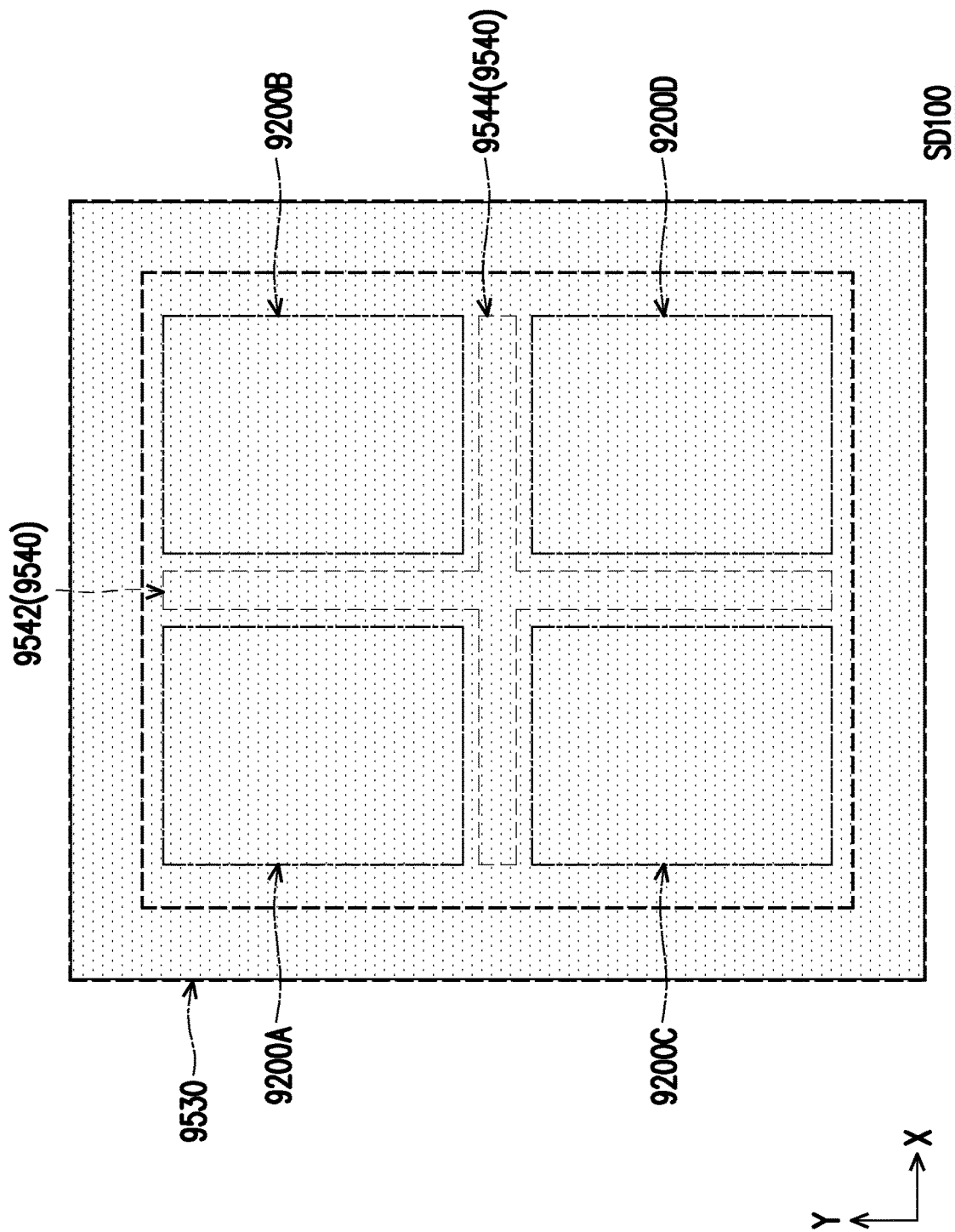
FIG. 15B is a schematic top view of a semiconductor device according to some embodiments of the disclosure.

FIG. 15A is a schematic cross-sectional view of a semiconductor device SD100 according to some embodiments of the disclosure. FIG. 15B is a schematic top view of the semiconductor device SD100 according to some embodiments of the disclosure. Referring to FIG. 15A and FIG. 15B, in some embodiments, the semiconductor device SD100 has a similar structure and can be manufactured following similar processes as previously described with respect to the semiconductor device SD40 of FIG. 8. In some embodiments, the semiconductor device SD100 includes the circuit substrate 9100 having one or more semiconductor packages 9200A, 9200B bonded thereto, and a metallic cover 9500 secured by the adhesives 9410, 9430 and TIMs 9420A, 9420B. In some embodiments, the metallic cover 9500 is composed of multiple pieces, similar to the metallic cover 3500 of FIG. 8. For example, the metallic cover 9500 includes the cover block 9505 having the outer flanges 9510 integrally formed with the cap 9520, and, as a separate piece, the support 9530. The cap 9520 presents a curved region CR100 of variable thickness over the semiconductor packages 9200A, 9200B in between the outer flanges 9510. The curved region CR100 may include one or more concave regions CV101, CV102 and one or more convex regions (not shown), depending on the warpage profile of the semiconductor packages 9200A, 9200B and the circuit substrate 9100. In some embodiments, one or more grooves 9540 may be formed in the bottom surface 9520b of the cap 9520, in regions of the cap 9520 not directly overlying the semiconductor packages 9200A, 9200B. For example, the concave region CV101 may be located over the semiconductor package 9200A, the concave region CV102 may be located over the semiconductor package 9200B, and the groove 9540 may be located in between the concave regions CV101, CV102, over the gap separating the semiconductor packages 9200A, 9200B. In some embodiments, the cap 9520 may present a variable thickness in the curved region CV101, with a thickness T9 at the end of the curved region CV101. A region of constant thickness T10 smaller than the thickness T9 and the curved region CV102 also of variable thickness (starting from the thickness T11 greater than the thickness T9) may then follow. As such, the thickness variation of the cap between the curved regions CV101, CV102 and the region of constant thickness T10 may result in the groove 9540.

In FIG. 15A the groove 9540 is illustrated as having a rectangular profile, but the disclosure is not limited thereto, and other profiles (rounded, sloped, etc.) may also be adopted. That is, the region forming the groove 9540 is not necessarily limited to have a constant thickness T10. As illustrated in FIG. 15B, the groove 9540 may extend at the sides of the semiconductor packages 9200A-9200D, and may include branches extending in different direction. For example, a branch 9542 of the groove 9540 may extend along the Y direction, on the gap separating the semiconductor packages 9200A and 9200C from the semiconductor packages 9200B and 9200D. Similarly, the branch 9544 of the groove 9540 may extend along the X direction, on the gap separating the semiconductor packages 9200A and 9200B from the semiconductor packages 9200C and 9200D. In some embodiments, the groove 940 is not limited to be formed in between semiconductor packages 9200A-9200D, and, for example, may be formed in the region of the cap 9520 extending between the semiconductor packages 9200A-9200D and the closer outer flange 9510. In some embodiments, including a cap 9520 with grooves 9540 formed therein at the sides of the semiconductor packages 9200A-9200D may reduce the deformation of the cap 9520 under thermal or mechanical stress. In some embodiments, the groove 9540 may be capable of dissipating stress generated during manufacturing, usage, or testing (e.g. high temperature storage, unbiased highly accelerated stress testing, temperature cycling, etc.) of the semiconductor device SD100. In some embodiments, deformation of the cap 9520 (and hence of the metallic cover 9500) may be alleviated, resulting in improved adhesion between the cap 9520 and the TIMs (e.g., 9420A, 9420B, etc.).

Figure 16:
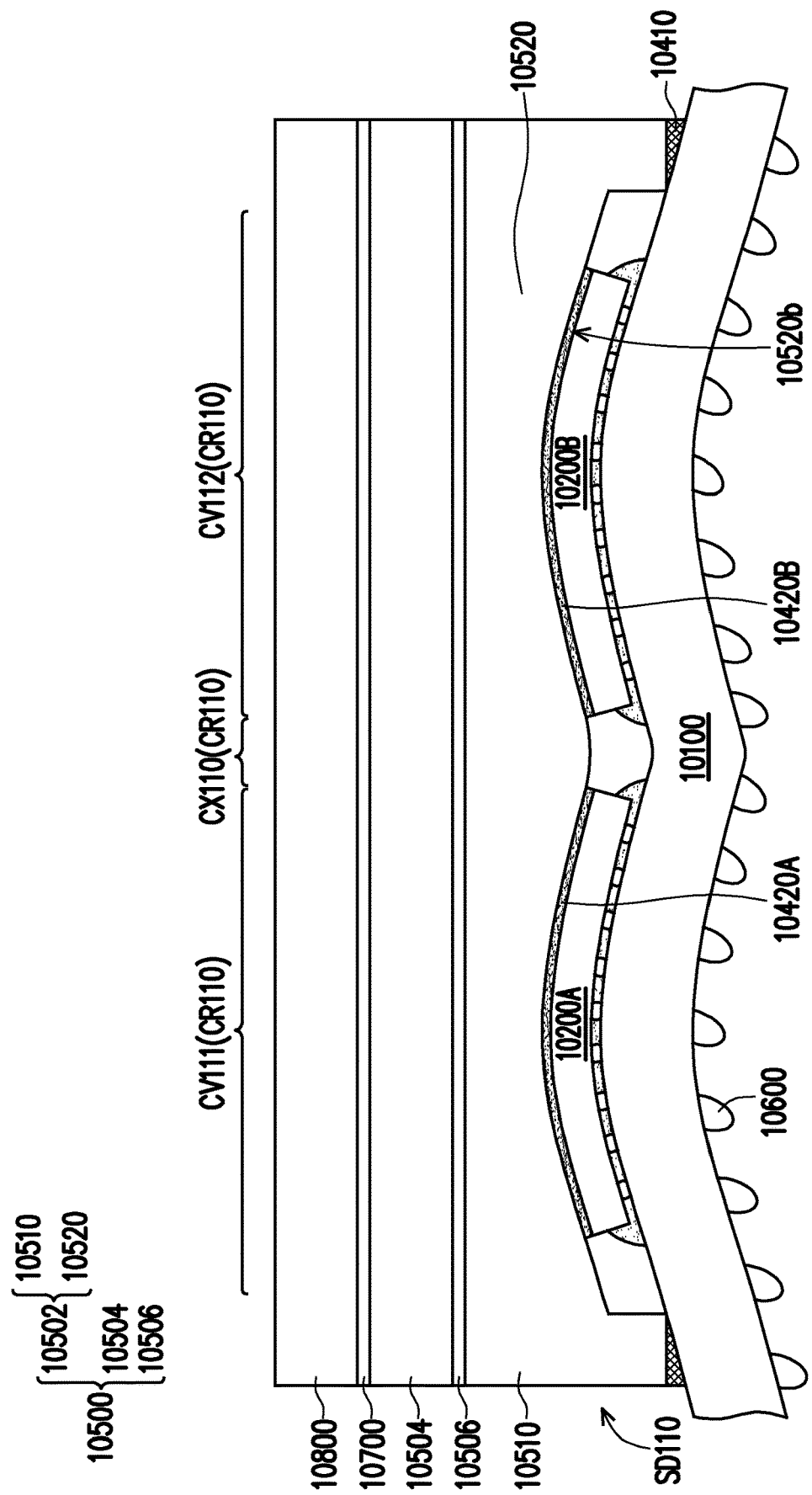
FIG. 16 is a schematic cross-sectional view of a semiconductor device integrated with additional components according to some embodiments of the disclosure.

In FIG. 16 is illustrated a schematic cross-sectional view of a semiconductor device SD110 according to some embodiments of the disclosure. In some embodiments, the semiconductor device SD110 has a similar structure and can be manufactured following similar processes as previously described with respect to the semiconductor device SD20 of FIG. 6. In some embodiments, the semiconductor device SD110 includes the circuit substrate 10100 having one or more semiconductor packages 10200A, 10200B bonded thereto, and a metallic cover 10500 secured by the adhesives 10410 and TIMs 10420A, 10420B. In some embodiments, the metallic cover 10500 is composed of multiple pieces, including a lower block 10502 and a top block 10504. The lower block 10502 may have a structure similar to the metallic cover 1500 of FIG. 6, including outer flanges 10510 extending up to the circuit substrate 10100 and a cap 10520 extending in between the outer flanges 10510 over the semiconductor packages 10200A, 10200B. The bottom surface 10520b of the cap 10520 presents a curved region CR110, including one or more concave regions CV111, CV112 and one or more convex regions CX110, according to the warpage profile of the semiconductor packages 10200A, 10200B and the circuit substrate 10100. The top block 10504 is disposed on the lower block 10502, with a bonding material 10506 disposed in between. In some embodiments, the top block 10504 is a plate of thermally conductive material. In some embodiments, the top block 10504 and the lower block 10502 include different materials. For example, the top block 10504 may include a material having a higher coefficient of thermal expansion than the lower block 10502, so that compressive force is generated by the top block 10504 on the lower block 10502, thus increasing the contact force between the lower block 10502 and the TIMs 10420A, 10420B. By doing so, thermal performance of the semiconductor device SD110 may be enhanced. For example, the top block 10504 may include a metal, such as copper, aluminum, or an alloy, the lower block 10502 may include silicon (which may be partially embedded on the top block 10504), AlSiC, Mo, Tungsten, alumina, CuMo, or the like, and the bonding material 10506 may include an adhesive, a bonding oxide layer, a molding compound, or the like. In some embodiments, the lower block 10502 is not limited to be an integrally formed piece. In some alternative embodiments, a multi-piece structure such as disclosed in any one of FIG. 7 to FIG. 15B may be adopted for the lower block 10502.

In FIG. 16 the semiconductor device SD110 is illustrated integrated with additional components, according to some embodiments of the disclosure. For example, connective terminals 10600 may be installed on the circuit substrate 10100 on the opposite side of the semiconductor packages 10200A, 10200B. Furthermore, additional TIM 10700 is disposed on the top block 10504, and a heat dissipator 10800 may be disposed on the additional TIM 10700 to aid in dissipating heat generated during usage of the semiconductor device SD110. In some embodiments, the heat dissipator 10800 and the top block 10504 have different structures (e.g., when the water cooling systems are used as heat dissipator 10800) and/or include different materials. In some embodiments, the heat dissipator 10800 is a heat dissipating system other than a block of thermally conductive. For example, it may be a water cooling system, a heat sink with fins and/or pins, a fan, etc.

Figure 17:
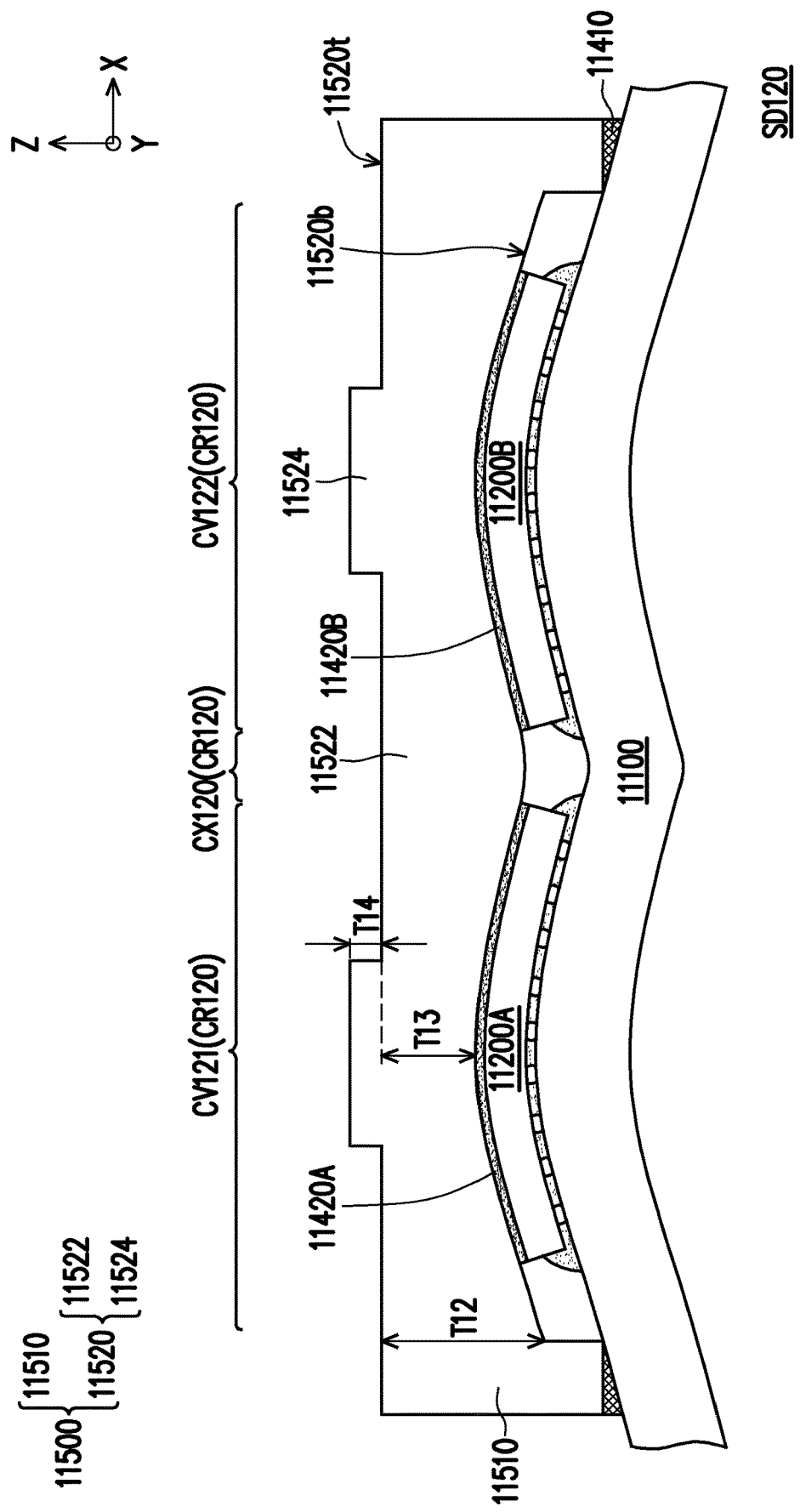
FIG. 17 is a schematic cross-sectional view of a semiconductor device according to some embodiments of the disclosure.

FIG. 17 is a schematic cross-sectional view of a semiconductor device SD120 according to some embodiments of the disclosure. In some embodiments, the semiconductor device SD120 has a similar structure and can be manufactured following similar processes as previously described with respect to the semiconductor device SD20 of FIG. 6. In some embodiments, the semiconductor device SD120 includes the circuit substrate 11100 having one or more semiconductor packages 11200A, 11200B bonded thereto, and a metallic cover 11500 secured by the adhesives 11410 and TIMs 11420A, 11420B. In some embodiments, the metallic cover 12500 includes the outer flanges 11510 contacting the adhesive 11410 and the cap 11520 extending over the semiconductor packages 11200A, 11200B. The outer flanges 11510 are connected to the periphery of the cap 11520, and, in some embodiments, are integrally formed with the cap 11520. The cap 11520 includes a body 11522 presenting a curved region CR120 of variable thickness over the semiconductor packages 11200A, 11200B in between the outer flanges 11510. The curved region CR120 may include one or more concave regions CV121, CV122 and one or more convex regions CX120, depending on the warpage profile of the semiconductor packages 11200A, 11200B and the circuit substrate 11100. That is, the bottom surface 11520b of the cap 11520 presents a curved profile matching the warpage profile of the semiconductor packages 11200A, 11200B and the circuit substrate 11100. In some embodiments, the cap 11520 also includes protrusions 11524 formed on an opposite side of the body 11522 with respect to the semiconductor packages 11200A, 11200B, at the top surface 11520t of the cap. 11520. In some embodiments, the semiconductor packages 11200A, 11200B may have a structure similar to the semiconductor package 200 of FIG. 2B, and the protrusions 11524 are formed in correspondence of the central chip 220 (illustrated in FIG. 2B), which may be, for example, a System-on-Chip. That is, the footprints of the protrusions 11524 overlaps with the chips 220 of the underlying semiconductor packages 11200A, 11200B. In some embodiments, the footprints of the protrusions 11524 match in shape, size, and/or position with the span of the chips 220 of the underlying semiconductor packages 11200A, 11200B. In some embodiments, the cap 11520 may present similar dimensions as previously described with respect to the cap 520 of FIG. 4. For example, the cap 11520 may present a thickness T12 at the joint of the cap 11520 with the outer flanges 11510. The thickness of the body 1522 of the cap 11520 may gradually vary, until reaching a thickness T13 along the Z direction, for example in correspondence of a local extreme (e.g., local minimum) of the concave region CV121. The protrusion 11524 may be disposed on the body 11522 also in correspondence of the concave region CV121, so that the total thickness of the cap 11520 may be given as the sum of the thickness of the body 11520 and the thickness T14 of the protrusion 11524. In some embodiments, the thickness T12 may be 0.6 to 40% greater than or smaller than the thickness T13, according to the warpage profile of the semiconductor packages 11200A, 11200B and the circuit substrate 11100. In some embodiments, the thickness T14 may be about 0.6 to 40% the thickness T13 of the body 11522 in correspondence of the underlying local extreme of the concave region CV121. In some embodiments, the thickness T13 is not particularly limited, and may be selected according to performance requirements. For example, the thickness T13 may be about in the range from 0.5 micrometers to 5 millimeters. In some embodiments, by forming the cap 11520 with the protrusions 11524, additional force may be applied in correspondence of the chip 220, to enhance the pressure contact between the metallic cover 11500, the TIMs 11420 and the semiconductor packages 11200A, 11200B.

Figure 18:
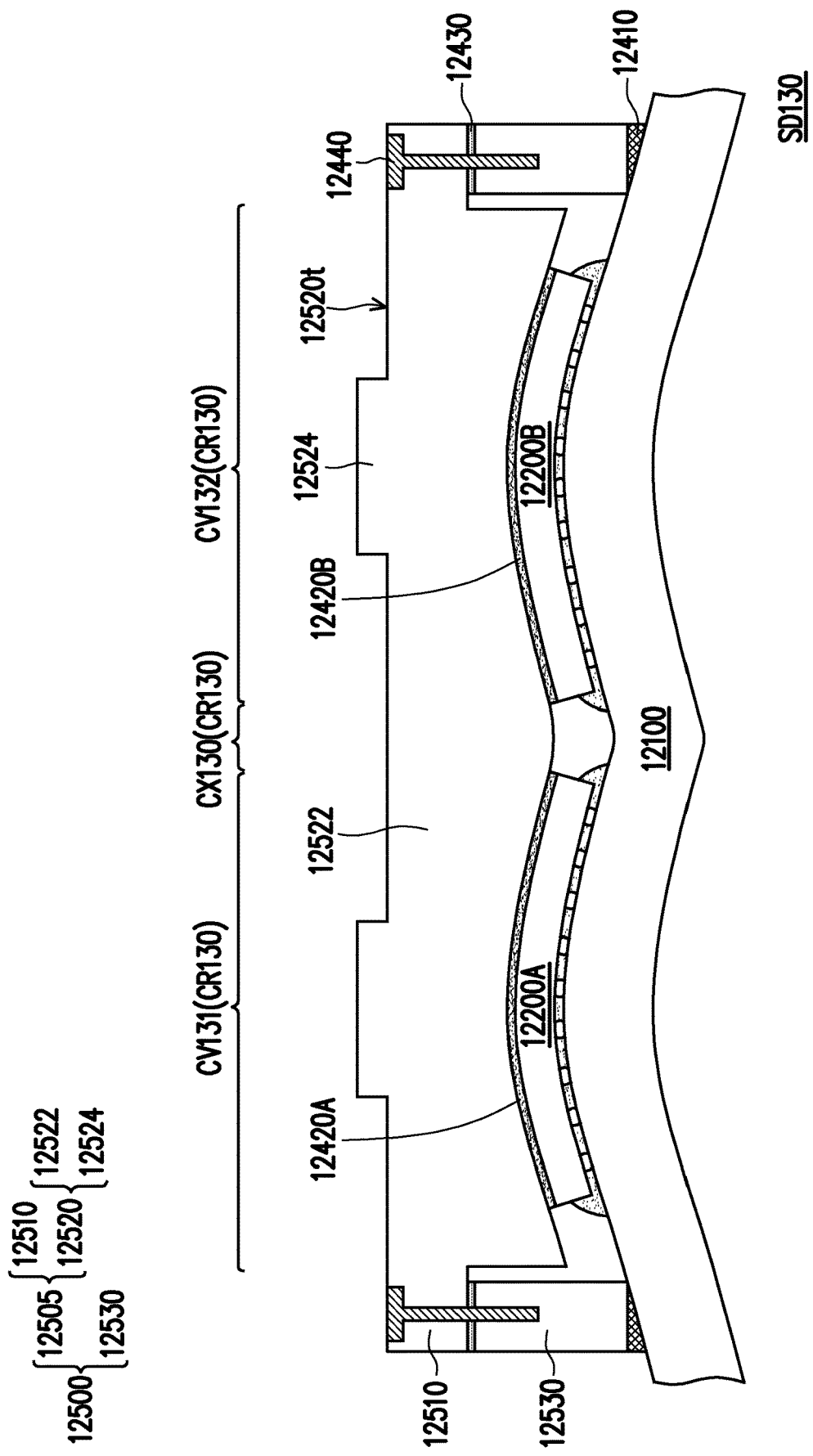
FIG. 18 is a schematic cross-sectional view of a semiconductor device according to some embodiments of the disclosure.

FIG. 18 is a schematic cross-sectional view of a semiconductor device SD130 according to some embodiments of the disclosure. In some embodiments, the semiconductor device SD130 has a similar structure and can be manufactured following similar processes as previously described with respect to the semiconductor device SD50 of FIG. 9. In some embodiments, the semiconductor device SD130 includes the circuit substrate 12100 having one or more semiconductor packages 12200A, 12200B bonded thereto, and a metallic cover 12500 secured by the adhesive 12410 and TIMs 12420A, 12420B. In some embodiments, the metallic cover 12500 is composed of multiple pieces, similar to the metallic cover 4500 of FIG. 9. For example, the metallic cover 12500 includes the cover block 12505 having the outer flanges 12510 integrally formed with the cap 12520, and, as a separate piece, the support 12530. The support 12530 may contact the adhesive 12410 on the circuit substrate 12100, and a rubber ring 12430 may be disposed between the support 12530 and the outer flanges 12510. Screws 12440 or other fasteners may secure the cover block 12505 to the support 12530. The cap 12520 includes the body 12522 presenting a curved region CR130 of variable thickness over the semiconductor packages 12200A, 12200B in between the outer flanges 12510. The curved region CR130 may include one or more concave regions CV131, CV132 and one or more convex regions CX130, depending on the warpage profile of the semiconductor packages 12200A, 12200B and the circuit substrate 12100. In some embodiments, the cap 12520 further includes protrusions 12524 formed on the top surface 12520t, similar to what was previously described for the metallic cover 11500 of FIG. 17. In some embodiments, by forming the cap 12520 with the protrusions 12524, additional force may be applied in correspondence of the central chips (e.g., the chip 220 illustrated in FIG. 2B) of the semiconductor packages 12200A, 12200B, to enhance the pressure contact between the metallic cover 12500, the TIMs 12420A, 12420B and the semiconductor packages 12200A, 12200B.

It should be noted that features of the disclosed embodiments may be combined according to production and design requirements. For example, while the metallic cover 9500 of FIG. 15A includes multiple pieces, the groove 9540 may also be formed in metallic covers in which the outer flanges extend up to the circuit substrate (e.g., the metallic cover 500 of FIG. 4 or 1500 of FIG. 6). Similarly, the support such as 7530 of FIG. 12, 9530 of FIG. 15A, or 12530 of FIG. 18 may include one or more ribs, as described for the support 5530 of FIG. 10b or 5535 of FIG. 10C. Neither are the cover blocks 7505 of FIG. 12, 8501-8504 of FIG. 14B, and 9510 of FIG. 15A limited to be attached to the corresponding supports 7530, 8530, or 9530 by adhesive. For example, in some alternative embodiments, rubber seals alone or in combination with screws (or similar fastener) may be used, as described for the metallic covers 2500 of FIG. 7 and 4500 of FIG. 9. Similarly, the cover block 12505 may be secured to the support 12530 without screws, and not necessarily with a rubber seal, but, for example, by adhesive. As another example, the protrusions 11524 of FIG. 17 and 12524 of FIG. 18 may be formed on any other one of the metallic covers of the disclosure.

In accordance with some embodiments of the disclosure, a semiconductor device includes a circuit substrate, a semiconductor package, and a metallic cover. The semiconductor package is disposed on the circuit substrate. The metallic cover is disposed over the semiconductor package and over the circuit substrate. The metallic cover comprises a cap and outer flanges. The cap overlies the semiconductor package. The outer flanges are disposed at edges of the cap, are connected with the cap, and extend towards the circuit substrate. A region of the bottom surface of the cap has a curved profile matching a warpage profile of the semiconductor package and the circuit substrate, and the region having the curved profile extends over the semiconductor package.

In accordance with some embodiments of the disclosure, a semiconductor device comprises a circuit substrate, a first semiconductor package, a thermal interface material, and a metallic cap. The first semiconductor package is disposed on the circuit substrate. The thermal interface material is disposed on a rear surface of the first semiconductor package. The rear surface of the semiconductor package is further away from the circuit substrate. The metallic cap extends on the thermal interface material over the first semiconductor package and the circuit substrate. The rear surface of the first semiconductor package presents a warped profile. The metallic cap includes a first region in direct contact with the thermal interface material over the semiconductor package. A thickness of the metallic cap varies throughout the first region conformally to the warped profile of the rear surface of the semiconductor package. The thickness is measured along a vertical stacking direction of the circuit substrate, the first semiconductor package, and the thermal interface material.

In accordance with some embodiments of the disclosure, a manufacturing method of a semiconductor device is provided. The manufacturing method includes the following steps. A semiconductor package is connected to a circuit substrate. The semiconductor package connected to the circuit substrate present a warped profile, and a rear surface of the semiconductor package is uneven. A first adhesive is disposed along edges of the circuit substrate. A metallic cover is placed over the semiconductor package. The metallic cover includes a cap having an uneven bottom surface with a complementary shape with respect to the rear surface of the semiconductor package. The uneven bottom surface of the cap is matched with the uneven rear surface of the semiconductor package. The metallic cover is bonded to the circuit substrate via the first adhesive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a circuit substrate,
   a semiconductor package, disposed on the circuit substrate,
   a metallic cover, disposed over the semiconductor package and over the circuit substrate, the metallic cover comprising:
      a cap overlying the semiconductor package;
      outer flanges, disposed at edges of the cap, connected with the cap, and extending from the cap; and
      a support, disposed between the outer flanges and the circuit substrate, and extending towards the circuit substrate;
   a first connecting component, disposed between the support and the circuit substrate, wherein the first connecting component comprises an adhesive; and
   a second connecting component, disposed between the support and the outer flanges, wherein the second connecting component comprises a rubber seal,
   wherein a region of a bottom surface of the cap has a curved profile matching a warpage profile of the semiconductor package and the circuit substrate, and the region having the curved profile extends over the semiconductor package, and
   wherein the support is laterally spaced from the cap by a gap.

2. The semiconductor device of claim 1, further comprising a thermal interface material disposed between the cap and the semiconductor package and contacting the region of the cap having the curved profile.

3. The semiconductor device of claim 1, wherein a top surface of the cap is substantially flat.

4. The semiconductor device of claim 1, further comprising fasteners extending through the outer flanges and the rubber seal to be tightened in the support.

5. The semiconductor device of claim 1, wherein a top surface of the cap is non-flat.

6. The semiconductor device of claim 5, wherein the cap of the metallic cover further comprises:
   at least one protrusion, located on the top surface of the cap opposite to the bottom surface, wherein the at least one protrusion is overlapped with the semiconductor package.

7. The semiconductor device of claim 1, further comprising a plurality of conductive terminals disposed on the circuit substrate, wherein the circuit substrate is disposed between and electrically coupled to the plurality of conductive terminals and the semiconductor package.

8. The semiconductor device of claim 1, wherein the support comprises:
   an outer frame located at an edge of the circuit substrate; and
   at least one rib connecting a pair of opposite edges of the outer frame.

9. A semiconductor device, comprising:
   a circuit substrate;
   a first semiconductor package disposed on the circuit substrate;
   a thermal interface material disposed on a rear surface of the first semiconductor package further away from the circuit substrate;
   a metallic cap, extending on the thermal interface material over the first semiconductor package and the circuit substrate,
   a support, disposed between the metallic cap and the circuit substrate;

a first connecting component, disposed between the support and the circuit substrate, wherein the first connecting component comprises an adhesive; and a second connecting component, disposed between the support and the metallic cap, wherein the second connecting component comprises a rubber seal, wherein the rear surface of the first semiconductor package presents a warped profile, wherein the metallic cap includes a first region in direct contact with the thermal interface material over the semiconductor package, wherein a thickness of the metallic cap varies throughout the first region conformally to the warped profile of the rear surface of the semiconductor package, the thickness being measured along a vertical stacking direction of the circuit substrate, the first semiconductor package, and the thermal interface material, and wherein the support is laterally spaced from the metallic cap by a gap.

10. The semiconductor device of claim 9, wherein the metallic cap includes a silver-diamond composite material.

11. The semiconductor device of claim 9, wherein the metallic cap comprises a cap and outer flanges extending laterally from the cap at a peripheral edge of the cap, wherein the outer flanges and the cap are integrally formed.

12. The semiconductor device of claim 11, wherein a thickness of the outer flanges is less than a thickness of the cap.

13. The semiconductor device of claim 11, wherein a thickness of the outer flanges over the support is constant.

14. The semiconductor device of claim 9, wherein
the first semiconductor package includes a central chip encapsulated by an encapsulant,
the metallic cap further includes a protrusion formed at a top surface of the metallic cap, and
a footprint of the protrusion overlaps with a span of the central chip.

15. The semiconductor device of claim 9, wherein the support is disposed between the outer flanges and the circuit substrate, wherein the support comprises:
an outer frame located at an edge of the circuit substrate; and
at least one rib connecting a pair of opposite edges of the outer frame.

16. A manufacturing method of a semiconductor device, comprising:
connecting a semiconductor package to a circuit substrate, wherein the semiconductor package connected to the circuit substrate presents a warped profile and a rear surface of the semiconductor package is uneven;

disposing a first connecting component along edges of the circuit substrate, wherein the first connecting component comprises an adhesive;

disposing a support over the first connecting component, the first connecting component being disposed between the support and the circuit substrate;

disposing a second connecting component over the support, wherein the second connecting component comprises a rubber seal;

disposing a metallic cover over the semiconductor package and over the circuit substrate, wherein the metallic cover includes a cap overlying the semiconductor package and having an uneven bottom surface with a complementary shape with respect to the rear surface of the semiconductor package and outer flanges disposed at edges of the cap and connected to with the cap, and the outer flanges extend from the cap, wherein the support is disposed between the outer flanges and the circuit substrate and extended towards the circuit substrate, and the second connecting structure is disposed between the support and the outer flanges, wherein the support is laterally spaced from the cap by a gap;

matching the uneven bottom surface of the cap with the uneven rear surface of the semiconductor package; and bonding the metallic cover to the circuit substrate via the second connecting component.

17. The manufacturing method of claim 16, wherein bonding the metallic cover to the circuit substrate comprises securing the outer flanges to the support via a fastener extending through the outer flanges and the second connecting component and being received in the support.

18. The manufacturing method of claim 16, wherein, before bonding, a top surface of the metallic cover opposite to the bottom surface has a curved profile, and, upon bonding, the top surface of the metallic cover becomes substantially flat.

19. The manufacturing method of claim 16, further comprising
disposing a plurality of conductive terminals on the circuit substrate, wherein the circuit substrate is disposed between and electrically coupled to the plurality of conductive terminals and the semiconductor package.

20. The manufacturing method of claim 16, wherein disposing the first connecting component comprises forming the first connecting component into a form of a frame following a profile of an outer periphery of the circuit substrate.

* * * * *